United States Patent
Nagumo

(10) Patent No.: US 8,390,657 B2
(45) Date of Patent: Mar. 5, 2013

(54) DRIVER CIRCUIT, OPTICAL PRINT HEAD, AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 551 days.

(21) Appl. No.: 12/588,481

(22) Filed: Oct. 16, 2009

(65) Prior Publication Data

US 2010/0097437 A1 Apr. 22, 2010

(30) Foreign Application Priority Data

Oct. 17, 2008 (JP) .................... 2008-268906

(51) Int. Cl.
*H01L 29/78* (2006.01)
*B41J 2/45* (2006.01)

(52) U.S. Cl. ........................ 347/132; 347/237

(58) Field of Classification Search .......... 347/132, 347/237, 247
See application file for complete search history.

(56) References Cited

U.S. PATENT DOCUMENTS

| | | | |
|---|---|---|---|
| 4,975,599 A | 12/1990 | Petrovick, Jr. et al. | |
| 5,012,162 A | 4/1991 | Chun | |
| 5,144,388 A | 9/1992 | Sawada et al. | |
| 5,355,008 A | 10/1994 | Moyer et al. | |
| 6,194,960 B1 | 2/2001 | Nagumo | |
| 6,274,896 B1 | 8/2001 | Gibson et al. | |
| 6,404,013 B1 | 6/2002 | Chen et al. | |
| 6,713,823 B1 | 3/2004 | Nickel | |
| 7,531,853 B2* | 5/2009 | Saito et al. | 257/272 |
| 2008/0017861 A1* | 1/2008 | Ishiguro | 257/59 |
| 2010/0182392 A1* | 7/2010 | Nagumo | 347/237 |

FOREIGN PATENT DOCUMENTS

| | | |
|---|---|---|
| JP | 09-234897 | 9/1997 |
| JP | 2005-153372 A | 6/2005 |
| JP | 2007-212912 A | 8/2007 |
| JP | 2007-253451 A | 10/2007 |
| JP | 2008-044148 A | 2/2008 |

* cited by examiner

*Primary Examiner* — Huan Tran

(74) *Attorney, Agent, or Firm* — Rabin & Berdo, P.C.

(57) ABSTRACT

A driver circuit in an optical print head uses driving transistors to drive a row of light-emitting elements. The gate electrodes of the driving transistors are at least partly oriented so that driving current flows in the channels below the gate electrodes in a direction different from the direction of the row the light-emitting elements. This orientation reduces the temperature dependency of the driving current, so that the optical print head can produce the same high image quality at low ambient temperatures as at room temperature.

15 Claims, 19 Drawing Sheets

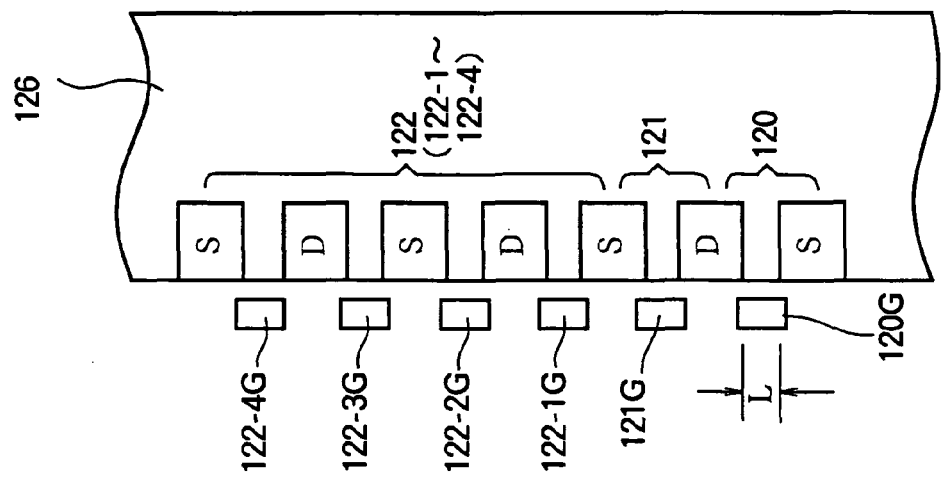
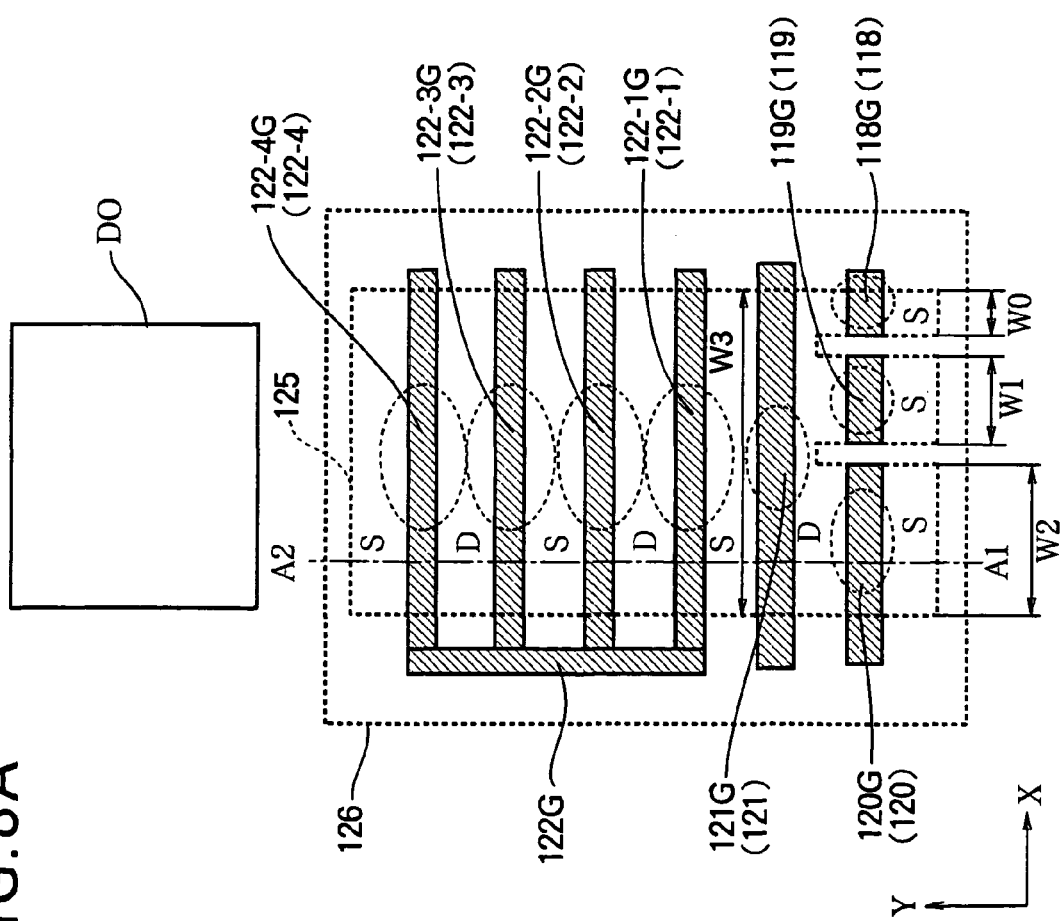

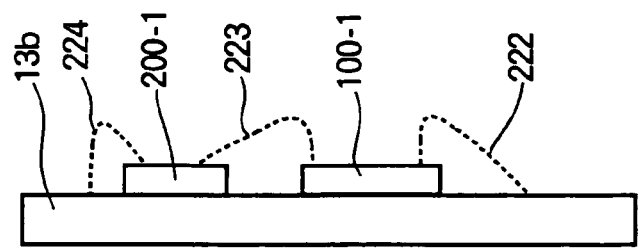
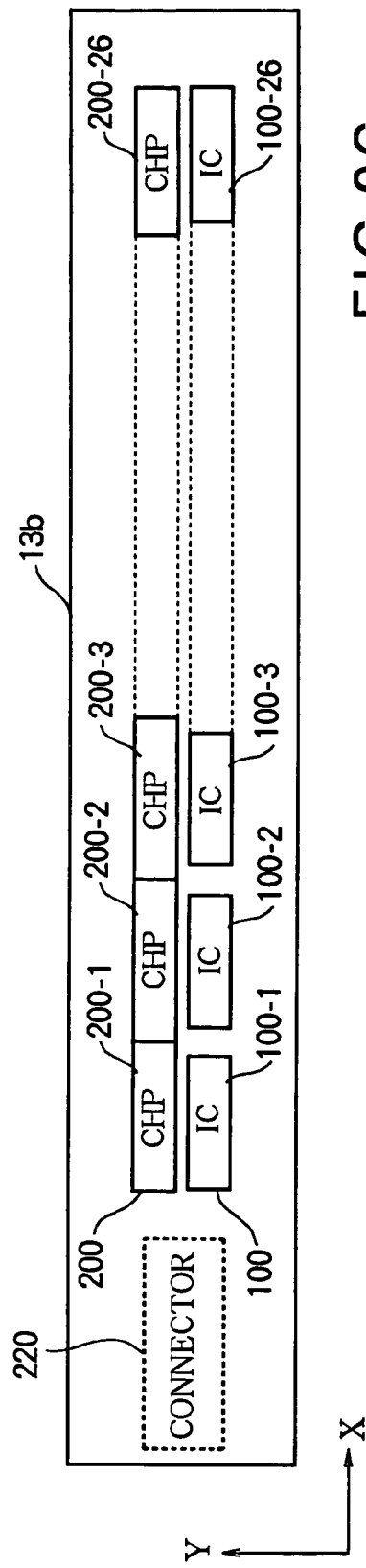
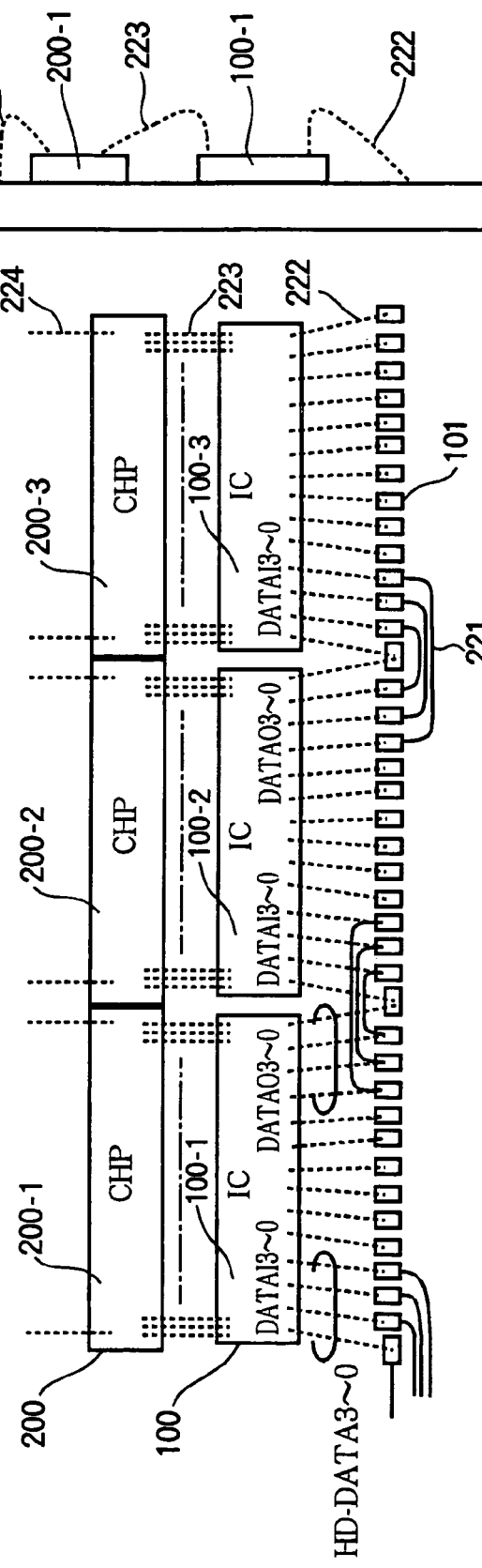

| SYMBOL | PIEZORESISTANCE COEFFICIENT PMOS [1/Pa] |
|---|---|
| $\Pi_{11}$ | $-66 \times 10^{-12}$ |
| $\Pi_{12}$ | $11 \times 10^{-12}$ |
| $\Pi_{44}$ | $-1380 \times 10^{-12}$ |
| $\Pi_S = \Pi_{11} + \Pi_{12}$ | $-55 \times 10^{-12}$ |

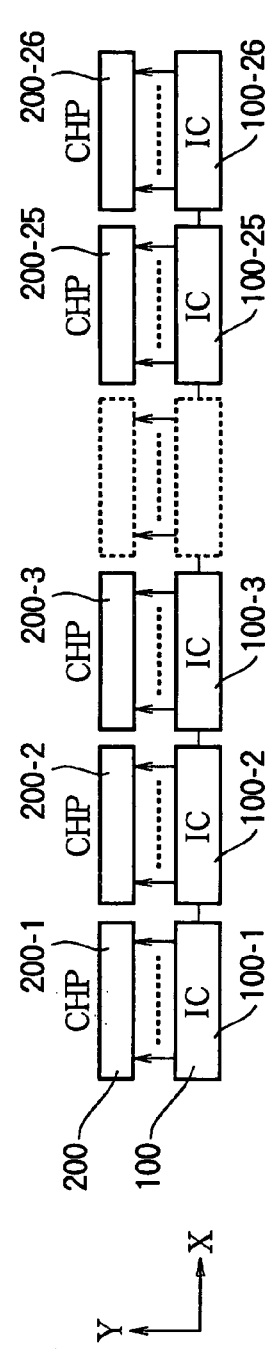
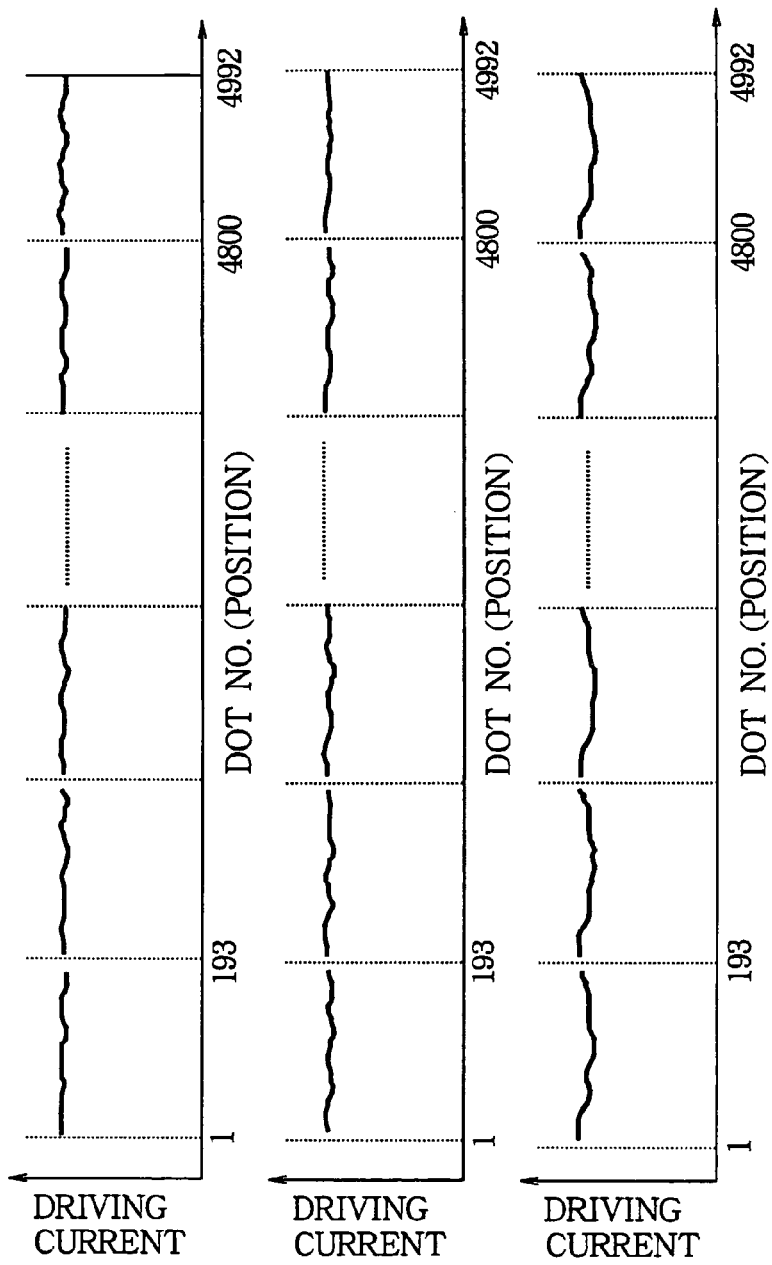
FIG.12A FIG.12B FIG.12C FIG.12D

US 8,390,657 B2

DRIVER CIRCUIT, OPTICAL PRINT HEAD, AND IMAGE FORMING APPARATUS

BACKGROUND OF THE INVENTION

1. Field of the Invention

The present invention relates to a driver circuit for driving a group of driven elements such as an array of dot printing elements in a printer, or an array of dot display elements in a display device. The invention also relates to an optical print head using this driving circuit, and to an image forming apparatus employing this optical print head.

2. Description of the Related Art

One type of image forming apparatus having an optical print head is an electrophotographic printer in which the optical print head includes a linear array of light-emitting diodes (LEDs). The LEDs are driven individually to print dot images as described in, for example, Japanese Patent Application Publication No. 2008-44148.

The driver circuits that drive the LEDs in a typical LED print head are silicon monolithic integrated circuits (ICs) mounted end to end on an elongated printed circuit board, forming a row parallel to the LED array. Each driver IC drives a consecutive group of LEDs.

The driver ICs are secured to the printed circuit board with a thermosetting plastic adhesive that is cured in a high-temperature atmosphere. The curing process takes place in a natural state with zero stress as long as the printed circuit board unit remains near the curing temperature, but on return to a room-temperature environment, the substrate material of the printed circuit board contracts by a greater amount than does the silicon of the driver ICs. As a result, the driver ICs experience compressive stress in their longitudinal direction, parallel to LED array.

The amount of compressive stress differs from place to place within each driver IC. The differences in stress produce differences between the driving currents output from different parts of the driver IC, resulting in unwanted differences in the amounts of light emitted by different LEDs. The variations in light emission degrade the printing quality of the electrophotographic printer by causing uneven density in the printed output. A particular problem is a pattern of dark streaks that appears at low ambient temperatures at positions corresponding to the central parts of the driver ICs.

SUMMARY OF THE INVENTION

A general object of the present invention is to reduce variations in driving current caused by stress.

A more specific object is to reduce variations in driving current supplied by a driver circuit that drives an array of driven elements.

A still more specific object is to reduce variations in driving current due to mechanical stress acting on the driver circuit at low ambient temperatures.

The invention provides a driver circuit having a plurality of driving transistors for supplying driving current to a plurality of driven elements. The driven elements are arranged in a row oriented in a first direction. The driving transistors have respective gate electrodes with respective first parts oriented so that the driving current is conducted below the first parts of the gate electrodes in a second direction differing from the first direction.

The second direction may be substantially orthogonal to the first direction, or may be at an acute angle to the first direction.

The gate electrodes may also have second parts below which driving current is conducted in a third direction differing from the second direction.

The inventor has found that when temperature-induced mechanical stress causes variations in the driving currents output by the driver circuit, the greatest variations occur if the gate electrodes of the driving transistors are oriented so that the driving current flows beneath the gate electrodes in the first direction, parallel to the array of driven elements. Orienting parts of the gate electrodes so that the driving current flows in a different direction therefore reduces the variations.

If the gate electrodes are oriented so that the driving current flows at a suitable angle to the first direction, the variations can be substantially eliminated.

Providing the gate electrodes with second parts below which current flows in a third direction differing from the second direction can also substantially eliminate the variations.

BRIEF DESCRIPTION OF THE DRAWINGS

In the attached drawings:

FIG. 8A is a schematic plan view of the driving transistors in FIG. 7 according to a first embodiment of the invention;

FIG. 8B is a sectional view of the driving transistor in FIG. 8A through line A1-A2;

FIG. 9A is a plan view of a printed wiring board assembly in the LED print head in FIG. 2;

FIG. 9B is an enlarged plan view of part of the LED print head in FIG. 9A;

FIG. 9C is a simplified side view of FIG. 9B;

FIG. 12A schematically illustrates the layout of an LED print head in the first embodiment;

FIG. 12B is a graph indicating values of the driving currents supplied to dots in the LED print head in FIG. 12A at an ambient temperature of 100° C.;

FIG. 12C is a graph indicating values of the driving currents supplied to the dots in the LED print head in FIG. 12A at an ambient temperature of 25° C.;

FIG. 12D is a graph indicating values of the driving currents supplied to the dots in the LED print head in FIG. 12A at an ambient temperature of −20° C.;

DETAILED DESCRIPTION OF THE INVENTION

Figure 1:
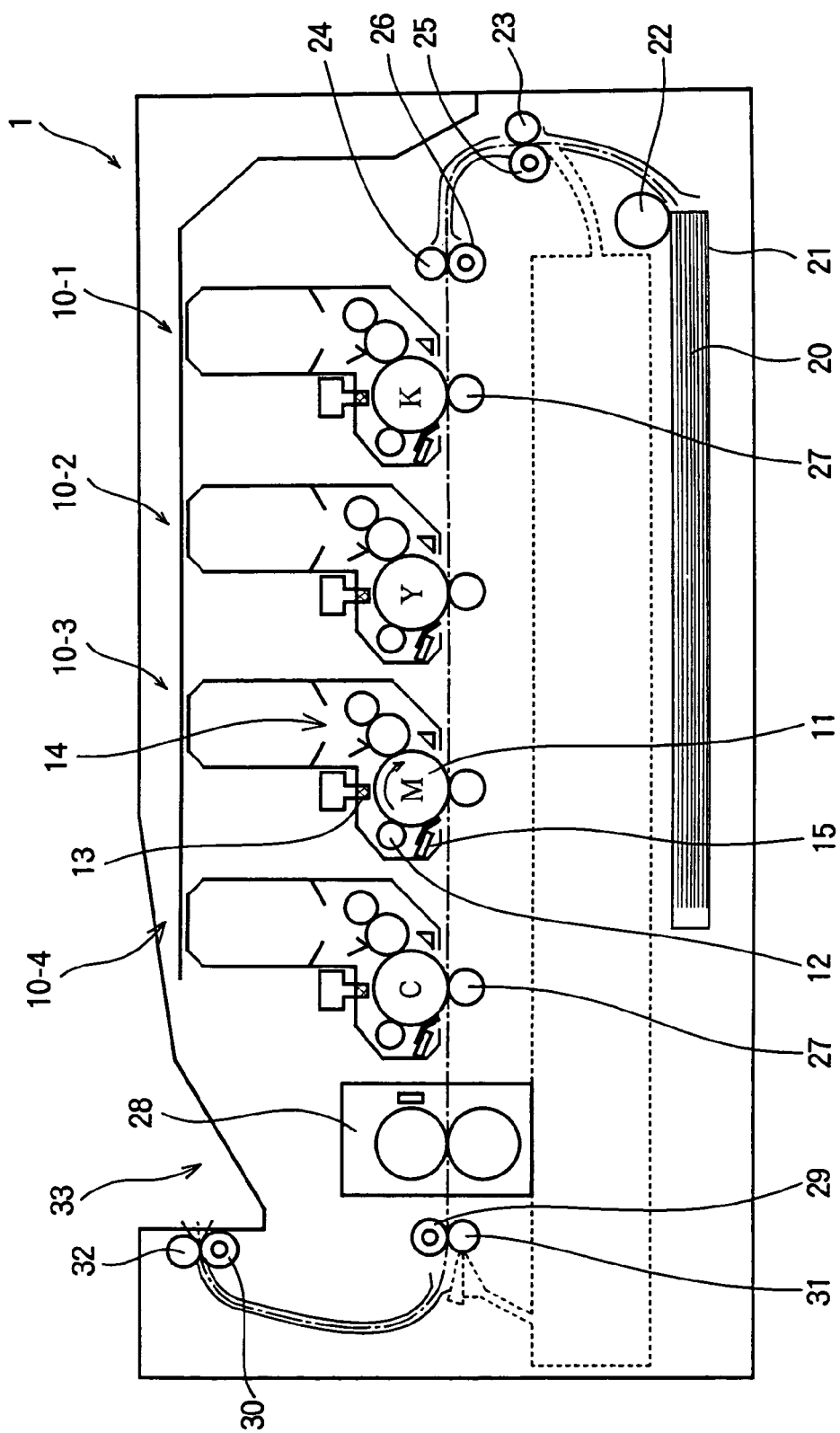
FIG. 1 is a simplified sectional view of a tandem color printer embodying the present invention.

Embodiments of the invention will now be described with reference to the attached non-limiting drawings, in which like elements are indicated by like reference characters.

First Embodiment

Optical print heads (LED print heads, for example) using light emitting elements (LEDs, for example) can be used in the tandem color printer illustrated in FIG. 1. This printer 1 includes process units 10-1 to 10-4 that print respective monochrome black (K), yellow (Y), magenta (M), and cyan (C) images. These units are placed one after another in the transport path of a recording medium 20, typically paper. The process units 10-1 to 10-4 have the same internal structure. The internal structure of the magenta process unit 10-3 will be described as an example.

Process unit 10-3 includes a photosensitive drum 11 that turns in the direction indicated by the arrow. Disposed around the photosensitive drum 11 are a charger 12 for charging the surface of the photosensitive drum 11 by supplying electrical charge, an exposure unit 13 for forming a latent image by selectively illuminating the surface of the charged photosensitive drum 11, a developing unit 14 for forming a toner image by applying magenta toner to the surface of the photosensitive drum 11 on which a latent image is formed, and a cleaning unit 15 for removing toner left after the toner image is transferred from the photosensitive drum 11 to the printing medium. The drums and rollers used in the process units are driven by a motor and gears (not shown).

In the description that follows, the exposure unit 13 is an LED print head. Each LED print head 13 comprises a linear array of LEDs for printing respective dots (also referred to as picture elements or pixels).

The printer 1 has at its bottom a paper cassette 21 for holding a stack of paper or other recording media 20. Disposed above the paper cassette 21 is a hopping roller 22 for taking sheets of the recording medium 20 separately from the paper cassette 21. Disposed downstream of the hopping roller 22 in the transport direction of the recording medium 20 are a pair of pinch rollers 23, 24, a transport roller 25 for transporting the recording medium 20 past pinch roller 23, and a registration roller 26 for transporting the recording medium 20 past pinch roller 24. The hopping roller 22, transport roller 25, and registration roller 26 are driven by a motor and gears (not shown).

Each of the process units 10-1 to 10-4 also includes a transfer roller 27, made of semiconductive rubber or a similar material, facing the photosensitive drum. A voltage applied to the transfer roller 27 creates an electrical potential difference between the surfaces of the photosensitive drum and the transfer roller 27. This potential difference transfers the toner image formed on the photosensitive drum onto the recording medium 20.

A fuser 28, which includes a heating roller and a backup roller, fuses the toner image onto the recording medium 20 by pressure and heat. A pair of delivery rollers 29 and 30 and a pair of pinch rollers 31 and 32 disposed downstream of the fuser 28 transport the recording medium 20 from the fuser 28 to a recording medium stacker 33. The delivery rollers are also driven by a motor and gears (not shown).

The operation of the tandem color printer 1 will be described briefly. The hopping roller 22 picks up the sheet at the top of the stack of recording medium 20 in the paper cassette 21. The recording medium 20 is carried between the transport roller 25 and pinch roller 23, aligned against the registration roller 26 and pinch roller 24, and then carried between the registration roller 26 and pinch roller 24 into the monochrome black process unit 10-1. As the recording medium 20 is transported between the photosensitive drum and transfer roller of process unit 10-1 by the rotation of its photosensitive drum, a monochrome black toner image is transferred onto the recording surface of the recording medium 20.

The recording medium 20 then passes through the other process units 10-2 to 10-4, which transfer yellow, magenta, and cyan toner images onto its recording surface. The toner images of all four colors are fused onto the recording medium 20 by the fuser 28 to form a full-color image, and the recording medium 20 is ejected by the delivery rollers 29 and 30 and their pinch rollers 31 and 32 onto the recording medium stacker 33 outside the printer 1.

Figure 2:
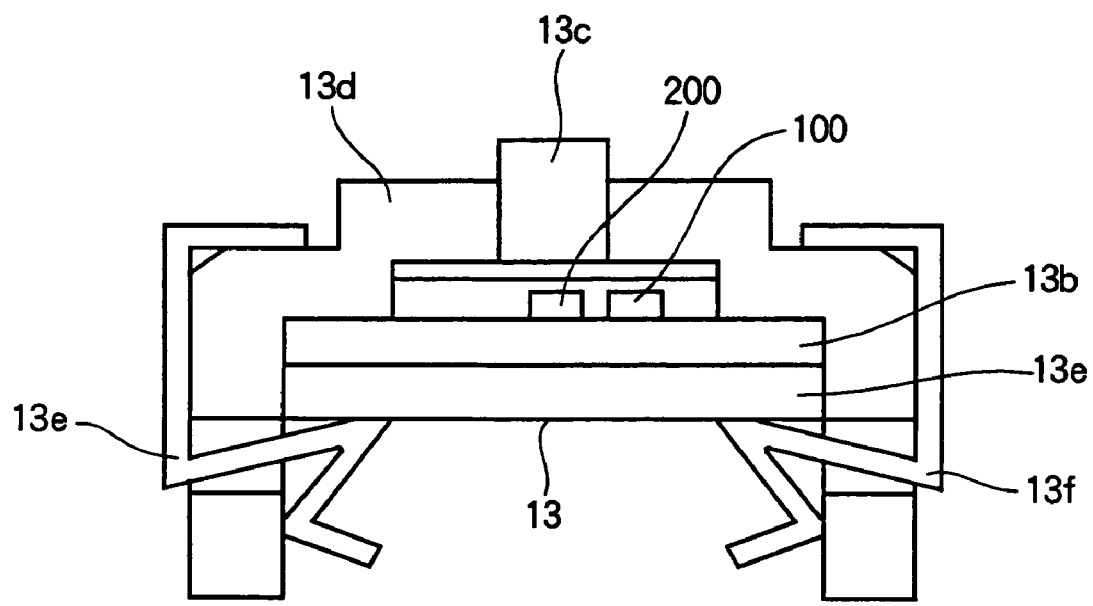
FIG. 2 is a schematic sectional view of one of the LED print heads in FIG. 1.

Referring to FIG. 2, the LED print head 13 in FIG. 1 includes a base 13a. The printed wiring board 13b with its driver ICs 100 and LED array chips 200 is mounted on the base 13a. The driver ICs 100 and LED array chips 200 are secured to the printed wiring board 13b with a thermosetting plastic, and are interconnected with bonding wires (not shown). A rod lens array 13c including an array of cylindrical optical elements that function as lenses is held above the LED arrays 200 in a holder 13d. The base 13a, printed wiring board 13b, and holder 13d are held together by a pair of clamping members 13e and 13f.

Figure 3:
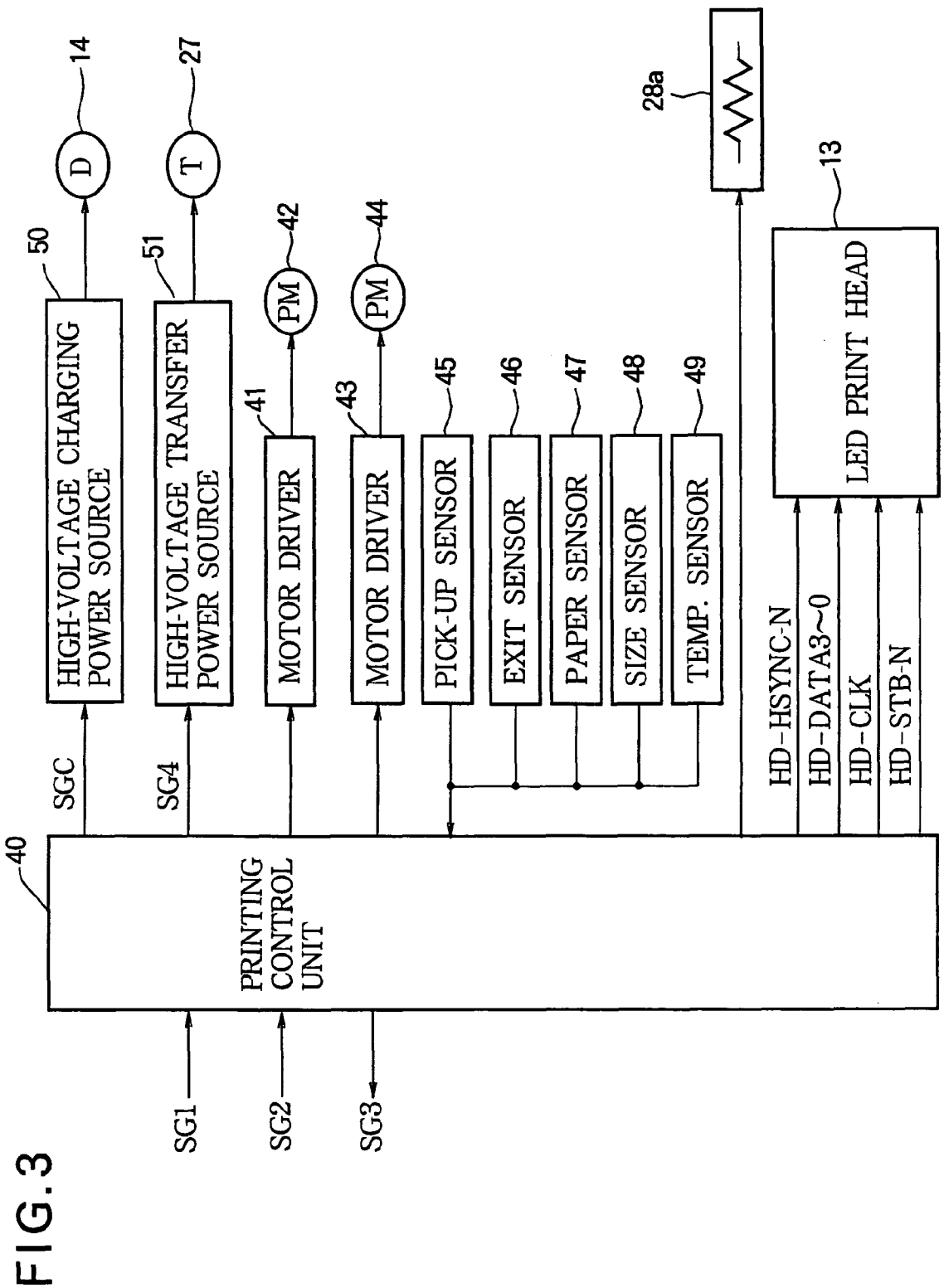
FIG. 3 is a block diagram of the printing control system of the printer in FIG. 1.

Referring to FIG. 3, the printing control circuit in the tandem color printer in FIG. 1 includes a printing control unit 40 having a microprocessor, read-only memory (ROM), random-access memory (RAM), input-output ports, timers, and other well-known facilities (not shown). Upon receiving signals SG1, SG2, etc. from a host controller (not shown), the printing control unit 40 generates signals that control a sequence of operations for printing dot-mapped data. The data are provided in signal SG2, which is sometimes referred to as a video signal because it supplies the dot-mapped data one-dimensionally. The printing control unit 40 is connected to the LED print heads 13 in the process units 10-1 to 10-4 in FIG. 1. For simplicity, only one LED print head 13 is shown in FIG. 3. The printing control unit 40 is also connected to the heating roller 28a in the fuser 28, motor drivers 41 and 43, a pick-up sensor 45, an exit sensor 46, a paper sensor 47, a size sensor 48, a temperature sensor 49, a high-voltage charging power source 50, and a high-voltage transfer power source 51. A develop/transfer process motor (PM) 42 is connected to motor driver 41, a paper transport motor (PM) 44 is connected to motor driver 43, the developing unit (D) 14 is connected to the high-voltage charging power source 50, and the transfer roller (T) 27 is connected to the high-voltage transfer power source 51.

The printing control circuit described above performs the operations described below.

The printing sequence starts when the printing control unit 40 receives a printing command from the host controller by means of control signal SG1. First, the temperature (Temp.) sensor 49 is checked to determine whether the heating roller 28a in the fuser 28 is at the necessary temperature for printing. If it is not, current is fed to the heating roller 28a to raise the temperature of the fuser 28 to the necessary temperature for printing. Next, motor driver 41 drives the develop/transfer process motor 42, the printing control unit 40 activates the high-voltage charging power source 50 by sending it a charge signal SGC, and current is fed to the developing unit 14.

In addition, the paper sensor 47 is checked to confirm that a recording medium 20 is present in the cassette in FIG. 1, and the size sensor 48 is checked to determine the size of the recording medium 20. If the recording medium 20 is present, the motor driver 43 drives the paper transport motor (PM) 44 according to the size of the recording medium, first in one direction to transport the recording medium 20 to a starting position sensed by the pick-up sensor 45, then in the opposite direction to transport the recording medium 20 into the printing mechanism.

When the recording medium 20 is in position for printing, the printing control unit 40 sends the host controller a timing signal SG3 (including a main scanning synchronization signal and a sub-scanning synchronization signal). The host controller responds by sending the dot data for one page in the video signal SG2. The printing control unit 40 sends corresponding dot data (HD-DATA3 to HD-DATA0) to each of the LED print heads 13 in synchronization with a clock signal (HD-CLK).

After receiving data for one line of dots in the video signal SG2 and sending the data to each of the LED print heads 13, the printing control unit 40 sends each of the LED print heads 13 a latch signal (HD-LOAD), causing each of the LED print heads 13 to store the print data (HD-DATA). The print data (HD-DATA3 to HD-DATA0) stored in each of the LED print heads 13 can then be printed while the printing control unit 40 is receiving the next print data from the higher-order controller in the video signal SG2.

A clock signal (HD-CLK), a synchronizing signal (HD-SYNC-N), and a strobe signal (HD-STB-N) are sent from the printing control unit 40 to each of the LED print heads 13. The print data (HD-DATA3 to HD-DATA0) are sent to the LED print heads 13 in synchronization with a clock signal (HD-SYNC-N).

The video signal SG2 is transmitted and received one printing line at a time. For each line, each of the LED print heads 13 forms a latent image of dots with a comparatively high electric potential on the negatively charged photosensitive drum 11. In the developing unit (D) 14, negatively charged toner is electrically attracted to the dots, forming a toner image.

The toner image is then transported to the transfer roller (T) 27. The printing control unit 40 activates the high-voltage transfer power source 51 by sending it a transfer signal SG4, and the toner image is transferred to the recording medium 20 as it passes between the photosensitive drum 11 and transfer roller 27. The recording medium 20 carrying the transferred toner image is transported to the fuser 28 including the heating roller 28a, where the toner image is fused onto the recording medium 20 by heat generated by the fuser 28. Finally, the recording medium 20 carrying the fused toner image is transported out of the printing mechanism, passing the exit sensor 46, and ejected from the printer.

The printing control unit 40 controls the high-voltage transfer power source 51 according to the information detected by the pick-up sensor 45 and size sensor 48 so that voltage is applied to the fuser 28 only while the recording medium 20 is passing through the fuser 28. When the recording medium 20 passes the exit sensor 46, the printing control unit 40 stops the supply of voltage from the high-voltage charging power source 50 to the developing unit 14, and halts the turning of the photosensitive drum and various rollers (not shown) by controlling the motor driver 41 that drives the develop/transfer process motor 42. The above operations are repeated to print a series of pages.

Figure 4:
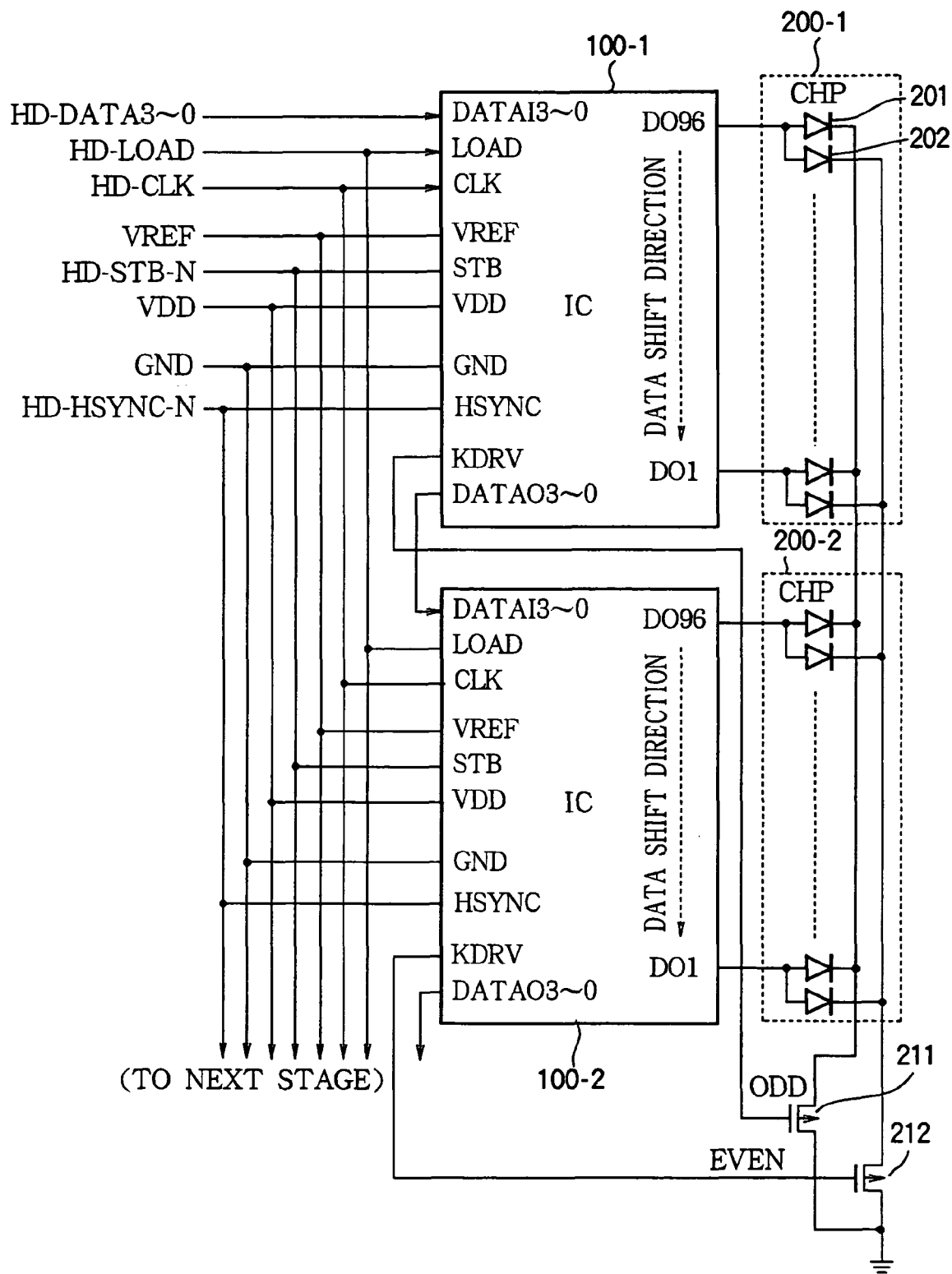
FIG. 4 is a partial block diagram of the LED print head in FIG. 2.

Referring to FIG. 4, the LED print head 13 in each of the process units 10-1 to 10-4 in FIG. 3 is capable of printing on A4 paper, for example, with a resolution of 600 dots per inch. This requires a linear array of 4,992 LEDs 201, 202, . . . , to print lines of 4,992 dots. These LEDs are disposed in twenty-six LED array chips 200-1, 200-2, . . . , each including 192 LEDs 201, 202, . . . . The cathodes of the odd-numbered LEDs 201, . . . are interconnected, the cathodes of the even-numbered LEDs 202, . . . are interconnected, and the anodes of mutually adjacent pairs of LEDs 201, 202, . . . are interconnected, enabling the odd-numbered LEDs 201, . . . and the even-numbered LEDs 202, . . . to be driven alternately.

Each of twenty-six LED array chips 200-1, 200-2, . . . is driven by one of twenty-six corresponding separate driver integrated circuits (ICs) 100-1, 100-2, . . . . The driver ICs have the same circuit structure, and their data terminals are connected in cascade to enable dot data to be passed from one driver IC to the next. For simplicity, only the first two LED array chips 200-1, 200-2 and the first two driver ICs 100-1, 100-2 are shown in FIG. 4.

The LED array includes the LEDs 201, 202 . . . on the LED array chips 200-1, 200-2, . . . and two power metal-oxide-semiconductor (MOS) transistors 211 and 212. The drain of power MOS transistor 211 is connected to the cathodes of the odd-numbered LEDs 201, . . . ; the drain of power MOS transistor 212 is connected to the cathodes of the even-numbered LEDs 202, . . . . The source terminals of the power MOS transistors 211, 212 are grounded. The gate of power MOS transistor 211 is connected to the cathode driving (KDRV) terminal of driver IC 100-1 and receives a signal denoted ODD; the gate of power MOS transistor 212 is connected to the KDRV terminal of driver IC 100-2 and receives a signal denoted EVEN.

Next, the operation of the LED print head 13 in FIG. 4 will be explained.

The driver ICs have data input terminals (DATAI3 to DATAI0) for receiving four-bit parallel print data signals (HD-DATA3 to HD-DATA0) in synchronization with a clock signal (HD-CLK). The first driver IC (IC 100-1) receives these signals from the printing control unit 40 in FIG. 3; the other driver ICs receive the print data signals from the data output terminals (DATAO3 to DATAO0) of the preceding driver IC, and receive the other signals from the printing control unit. The four bits of print data received with each clock pulse pertain to the four odd-numbered LEDs or four even-numbered LEDs in a group of eight consecutive LEDs. The driver ICs 100-1, . . . have internal flip-flops (not visible) that form a shift register for holding bit data DATAI0 to DATAI3 for 2,496 dots, and latch circuits (not shown) into which the data are loaded from the shift register in synchronization with a latch signal (HD-LOAD).

The latched data are output in synchronization with a strobe signal (HD-STB-N) to drive the LEDs 201, 202, . . . in the LED array chips with driving current regulated by a reference voltage VREF received from a reference voltage generating circuit (not shown) in the LED print head 13. A synchronizing signal HD-SYNC-N determines whether the even-numbered or odd-numbered LEDs are driven. After the even or odd dot data have been latched, the even or odd LEDs in the LED array chips are driven according to the latched dot data in synchronization with a strobe signal (HD-STB-N). The driver ICs 100-1, 100-2, . . . also have power supply (VDD) and ground (GND) terminals for receiving power.

Figure 5:
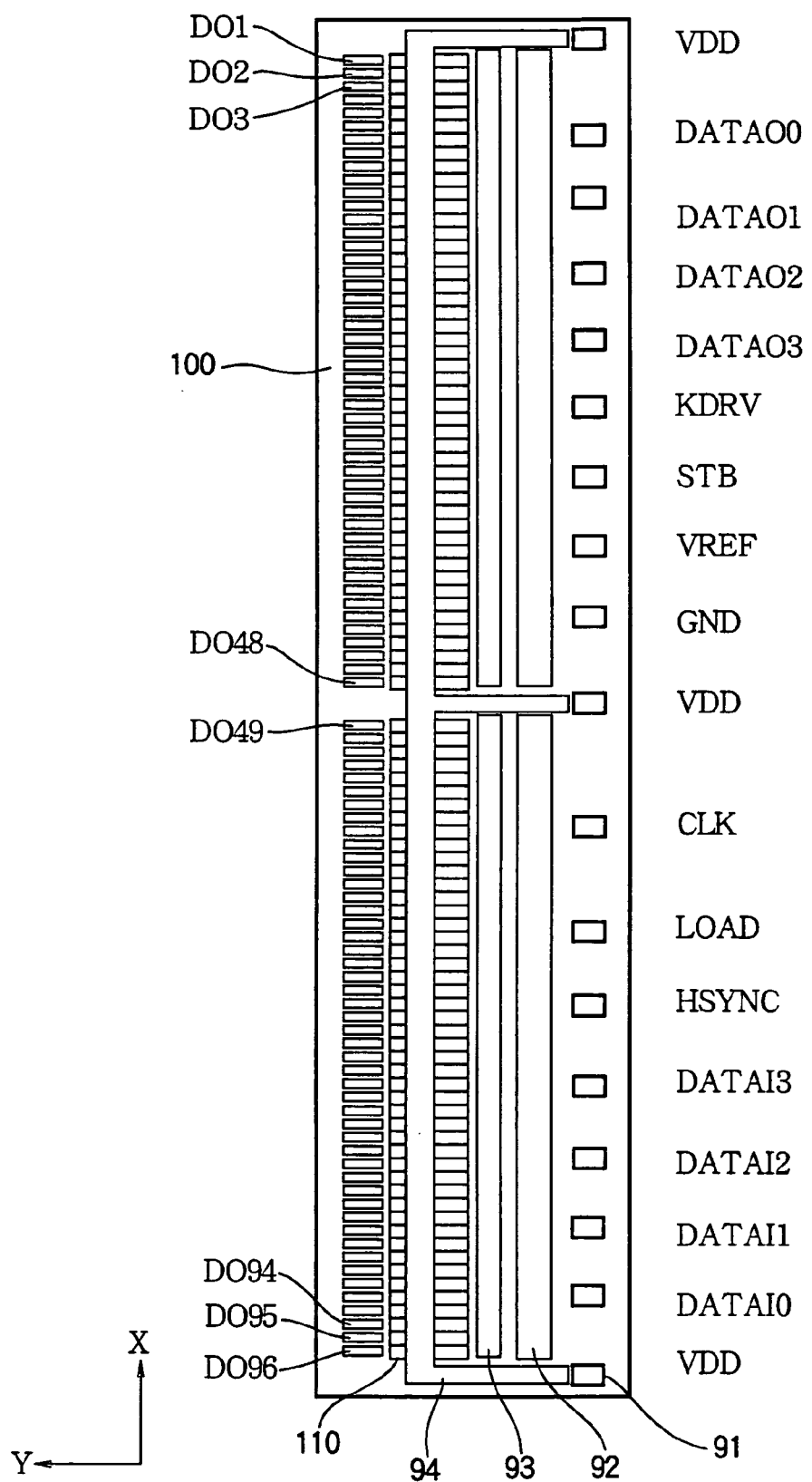
FIG. 5 is a plan view of one of the driver ICs in FIG. 4.

The layout of the terminal pads and internal circuits in a driver IC 100 (one of the driver ICs 100-1, 100-2, . . . in FIG. 4) is illustrated in FIG. 5. The X axis in FIG. 5 indicates the longitudinal direction, parallel to the long sides of the driver IC 100. The Y axis indicates the orthogonal direction, parallel to the ends of the driver IC 100. The letters X and Y will be used to denote these directions throughout the following description.

The driver IC 100 includes a row of signal and power pads 91, a data handling circuit 92, a driver pre-stage circuit 93, a power supply line 94, a row of driving circuits 110, and a longitudinal row of driving current output terminal pads DO1 to DO96. The row of signal and power pads 91 includes, in sequence from bottom to top in the drawing, terminal pads for power supply (VDD), bit data input (DATAI0 to DATAI3), synchronizing signal input (HSYNC), latch signal input (LOAD), clock signal input (CLK), power supply (VDD), ground (GND), reference voltage input (VREF), strobe signal input (STB), cathode driving signal output (KDRV), bit data output (DATAO3 to DATAO0), and power supply (VDD). The power supply line 94 is routed over the driving circuits 110, and is connected to the three VDD terminal pads.

Figure 6:
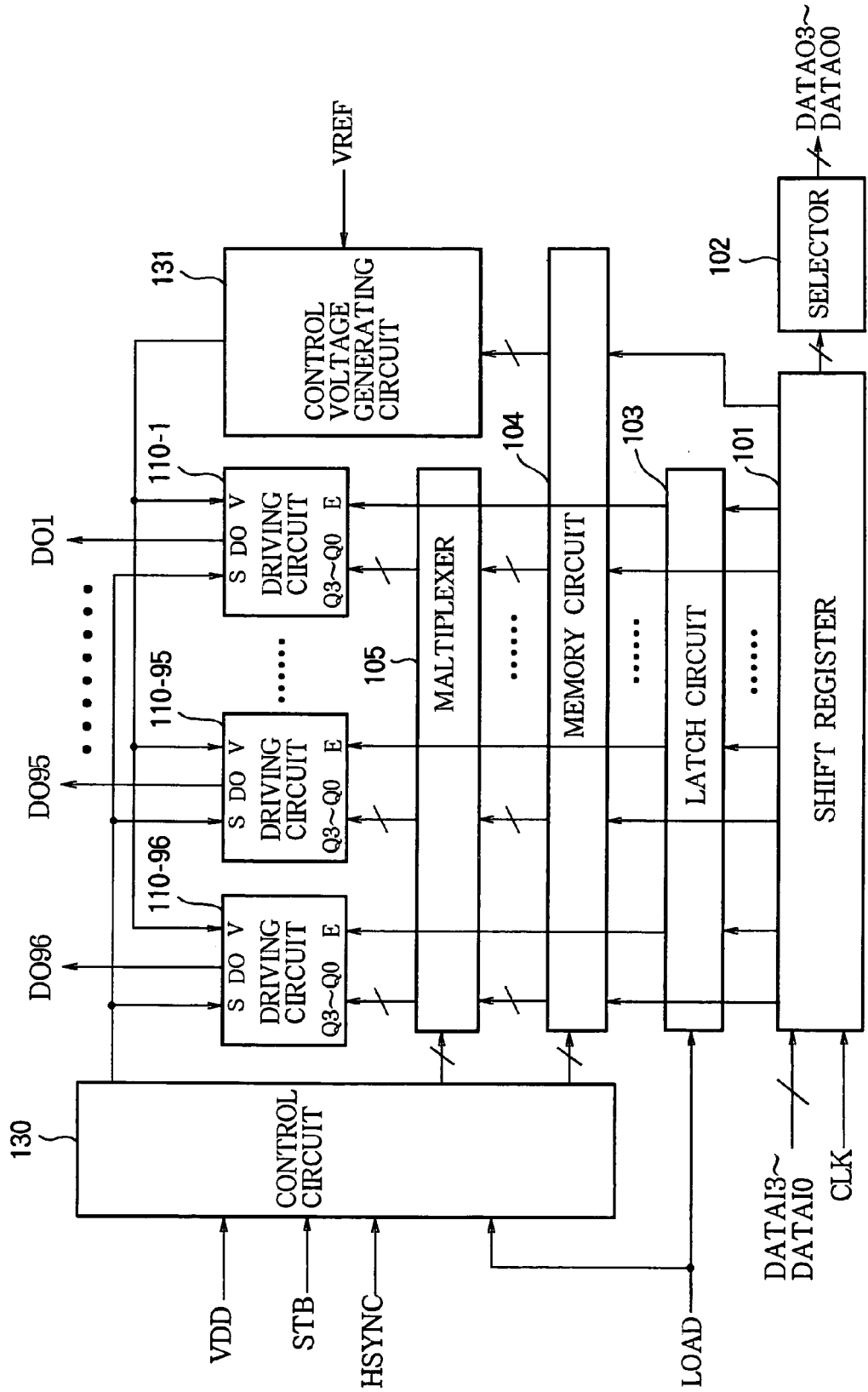
FIG. 6 is a block diagram of the driver IC in FIG. 5.

Referring to FIG. 6, the driver IC 100 has internal flip-flops (not shown) that form a shift register 101. The data terminals of the internal flip-flops are connected in cascade. The shift register 101 receives bit data (DATAI3 to DATAI0) in synchronization with a clock signal (CLK), and passes the bit data from one flip-flop to the next. A selector 102, a latch circuit 103, and a memory circuit 104 are connected to the output terminals of the shift register 101. The selector 102 generates output bit data (DATAO3 to DATAO0) by selecting some of the outputs from the shift register 101. All of the bit data held in the shift register 101 are loaded into the latch circuit 103 in synchronization with the latch signal (LOAD).

The shift register 101, selector 102, and latch circuit 103 constitute the data handling circuit 92 in FIG. 5.

The memory circuit 104 stores compensation data (dot compensation data) for compensating for LED-to-LED differences in light output within one LED array chip and compensation data (chip compensation data) for compensating for chip-to-chip differences in light output between the LED array chips, or for differences attributable to the driver ICs. The multiplexer 105 is connected to the output terminals of the memory circuit 104, and switches between the dot compensation data for the odd-numbered dots and the dot compensation data for the even-numbered dots. A plurality (ninety-six, for example) of driving circuits 110-1 to 110-96 for driving the LEDs are connected to the output terminals of the multiplexer 105. The driving circuits 110-1 to 110-96 receive a control voltage (V), an on/off control signal (S), bit data (E) from the latch circuit 103, and dot compensation data (Q3 to Q0) from the multiplexer 105. When the control signal (S) is asserted, each driving circuit feeds current from its driving current output terminal (DO) to one of the LEDs according to the bit data and compensation data.

The driver IC 100 also includes a control circuit 130 and a control voltage generating circuit 131. The control circuit 130 receives the power supply (VDD), strobe signal (STB), synchronizing signal (HSYNC), and latch signal (LOAD), generates the on/off control signal (S) from the strobe signal (STB) and latch signal (LOAD), supplies the on/off control signal (S) to the driving circuits 110-1 to 110-96, generates command signals for writing compensation data into the memory circuit 104, and generates a command signal for switching the multiplexer 105 between odd-numbered dot compensation data and even-numbered dot compensation data. The control voltage generating circuit 131 receives the reference voltage (VREF) and generates the control voltage (V) supplied to the driving circuits 110-1 to 110-96.

The memory circuit 104, multiplexer 105, control circuit 130, and control voltage generating circuit 131 constitute the driver pre-stage circuit 94 in FIG. 5.

When the driver IC 100 receives print data signals (HD-DATA3 to HD-DATA0), bit data (DATAI0 to DATAI3) for 2,496 dots are shifted into the shift register 101 in synchronization with the clock signal (CLK), then loaded from the shift register 101 into the latch circuit 103 in synchronization with the latch signal (LOAD). Next the strobe signal STB is asserted, and the driving circuits 110-1 to 110-96 generate current at their driving current output terminals DO1 to DO96 to drive the even-numbered or odd-numbered LEDs according to the latched bit data and stored compensation data.

Figure 7:
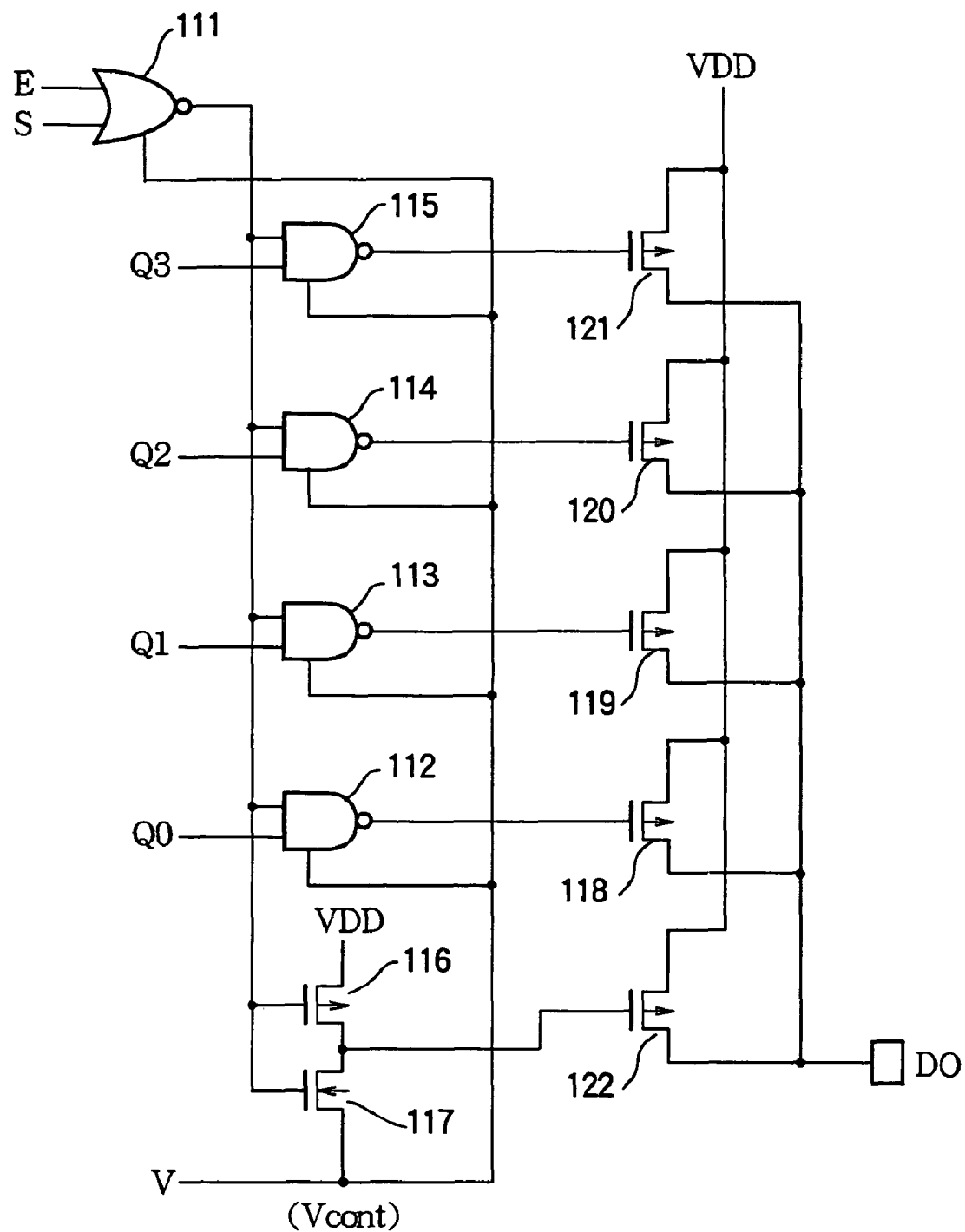
FIG. 7 is a circuit diagram of one of the driving circuits in FIG. 6.

Referring to FIG. 7, each one of the driver ICs 110-1 to 110-96 in FIG. 6 includes a NOR circuit 111 that takes the logical NOR (NOT OR) of bit data (E) received from the latch circuit 103 and the on/off control signal (S) received from the control circuit 130. The output terminal of the NOR circuit 111 is connected to the input terminals of four NAND circuits 112 to 115, and to the gates of a p-channel MOS (PMOS) transistor 116 and an n-channel MOS (NMOS) transistor 117. Each of the NAND circuits 112 to 115 takes the logical NAND (NOT AND) of the output signal received from the NOR circuit 111 and compensation data received from the multiplexer 105. The power supply terminals (not shown) of the NOR circuit 111 and NAND circuits 112 to 115 are connected to the power supply (VDD), and the ground terminals of these circuits are connected to terminal V and held at the control voltage Vcont. PMOS transistor 116 and NMOS transistor 117 are connected in series between the power supply VDD and terminal V, forming an inverter that inverts the signal received from the NOR circuit 111 and generates an inverted signal.

The output terminals of the NAND circuits 112 to 115 are connected to the gate terminals of respective PMOS transistors 118 to 121. The drain terminals of PMOS transistor 116 and NMOS transistor 117 are connected to the gate terminal of another PMOS transistor 122. The source terminals of PMOS transistors 118 to 122 are connected to the power supply VDD. The drain terminals of PMOS transistors 118 to 122 are connected to the driving current output terminal DO, which is connected to the anode of one of the LEDs with thin-film wiring, or by a bonding wire.

The difference between the power supply voltage VDD and the control voltage Vcont is slightly greater than the gate-source voltage Vt at which PMOS transistors 118 to 122 turn on, so that PMOS transistors 118 to 122 operate as current sources that supply differing amounts of current, which can be adjusted by adjusting the control voltage Vcont. The control voltage generating circuit 131 in FIG. 6 receives the reference voltage (VREF), and adjusts the control voltage Vcont.

Next, the operation of the driving circuit in FIG. 7 will be explained.

When the bit data (E) received as print data from the latch circuit 103 and the on/off control signal (S) are both in the active state (the input levels at the E and S terminals are both low), the output of the NOR circuit 111 is high, so the output level of the inverter formed by PMOS transistor 116 and NMOS transistor 117 is the control voltage Vcont, and PMOS transistor 122, which is the main driving transistor, is turned on to supply current to the driven LED. The output signal levels of the NAND circuits 112 to 115 are VDD or Vcont, depending on the compensation data received at the Q0 to Q3 input terminals. PMOS transistors 118 to 121, which are auxiliary driving transistors, are switched on or off accordingly to supply additional driving current to adjust the amount of light emitted by the driven LED.

The main PMOS driving transistor 122 is therefore driven in accordance with the print data, and when PMOS transistor 122 is turned on (when the output of the NOR circuit 111 is high), the auxiliary PMOS driving transistors 118 to 121 are selectively driven in accordance with the dot compensation data Q0 to Q3 received from the multiplexer 105. The driving current supplied from terminal DO to the LED is the sum of the drain current of the main driving transistor 122 and the drain currents of the selected auxiliary driving transistors 118 to 121. PMOS transistors 118 to 122 combine to operate as an adjustable and switchable current source that can be switched on to provide an adjustable amount of current.

PMOS transistors 118 to 121 are turned on when the outputs of the NAND circuits 112 to 115 are low, but the low output level is substantially equal to the control voltage Vcont, so the gate voltage of PMOS transistors 118 to 121 is substantially equal to Vcont. Similarly, PMOS transistor 122 is turned on when PMOS transistor 116 is in the off state and NMOS transistor 117 is in the on state, so the gate voltage of PMOS transistor 122 is substantially equal to Vcont. Therefore, PMOS transistors 118 to 122 are all switched on and off by logic circuits powered by the power supply voltage VDD and control voltage Vcont, and the drain currents of PMOS transistors 118 to 122 can all be adjusted by adjusting the control voltage Vcont.

Since the NAND circuits 112 to 115 use VDD and Vcont as their high and low power supply voltages, the high and low logic levels of their input signals may likewise be VDD and Vcont, or VDD and a voltage level between Vcont and 0 V; the low input logic level does not have to be 0 V.

In the first embodiment, PMOS transistors 118 to 122 in FIG. 7 are configured as shown in plan view in FIG. 8A and in sectional view in FIG. 8B, which shows a section through line A1-A2 in FIG. 8A. The X and Y axes in FIG. 8A are oriented as in FIG. 5, the X axis being the longitudinal direction of the driver IC. The hatching in FIG. 8A indicates the gate electrodes of PMOS transistors 118 to 122. FIG. 8A also shows the driving current output terminal DO.

The active area of the PMOS transistors 118 to 122 is a source-channel-drain area 125 in an n-type silicon substrate 126. PMOS transistor 122 is configured as four PMOS transistors 122-1 to 122-4 connected in parallel, with respective gate electrode fingers 122-1G to 122-4G extending from a common gate terminal 122G. The gate electrodes 118G to 121G of PMOS transistors 118 to 121 and the gate terminal and electrodes 122G and 122-1G to 122-4G of PMOS transistor 122 are formed from, for example, polysilicon, separated by an oxide insulating film (not shown) from the n-type silicon substrate 126.

In a variation of the first embodiment, the polysilicon gate electrode fingers 122-1G to 122-4G of PMOS transistor 122 are interconnected by metal wiring instead of by the common polysilicon gate terminal 122G.

Source (S) and drain (D) regions are formed in the silicon substrate 126 as shown in FIG. 8B. Source regions alternate with drain regions so that each of the gate electrodes 118G to 121G and 122-1G to 122-4G has a source region on one side and a drain region on the other side. The source and drain regions are p-type regions doped with p-type impurity ions implanted using the gate electrode and gate electrode fingers as a mask.

PMOS transistors 118 to 121 and 122-1 to 122-4 are indicated very approximately by the dashed ellipses and circles in FIG. 8A. Each of the PMOS transistors 118 to 121 and 122-1 to 122-4 comprises a gate electrode, the adjacent source and drain regions, and a channel disposed in the substrate 126 below the gate electrode, between the source and drain regions.

The source regions of the PMOS transistors are connected by metal wiring (not shown) to the power supply VDD (not shown) and the drain regions are connected by metal wiring (not shown) to the driving current output terminal DO in FIG. 8A. The PMOS transistors 118 to 122 and the surrounding substrate 126 in FIG. 8A are covered by a protective passivation film (not shown).

All of the gate electrodes and gate electrode fingers have the same gate length L, but the gate width W0 of gate electrode 118G, the gate width W1 of gate electrode 119G, the gate width W2 of gate electrode 120G, and the gate width W3 of gate electrodes 121G and 122-1G to 122-4G are related as follows.

$$W1 = 2*W0$$

$$W2 = 4*W0$$

$$W3 = 8*W0$$

The printed wiring board assembly in the LED print head in FIG. 2 will now be described in more detail, with reference to the plan view in FIG. 9A, the enlarged plan view in FIG. 9B, and the simplified side view in FIG. 9C.

Referring to FIG. 9A, the plurality (e.g., twenty-six) of LED array chips 200 (200-1 to 200-26) and the matching plurality of driver ICs 100 (100-1 to 100-26) are mounted on the flat upper surface of the printed wiring board 13b, placed end-to-end in the longitudinal direction or X-axis direction of the printed wiring board 13b. This is also the direction of the row of LEDs (not shown) in the LED array chips 200. A connector 220 including terminals for control signals for controlling the LED print head and terminals for power supply (VDD) and ground (GND) is also mounted on the upper surface of the printed wiring board 13b.

Referring to FIG. 9B, a row of terminal pads 101 is formed on the upper surface of the printed wiring board 13b, parallel to the row of driver ICs 100. Some of these terminal pads 101 are mutually interconnected by wiring 221; others are connected by wiring (partially shown) to the connector 220 in FIG. 9A.

Referring to FIG. 9C, the terminal pads on the printed wiring board 13b are connected to the appropriate terminal pads of the driver ICs 100-1, . . . by bonding wires 222. The driving current output terminal pads of the driver ICs 100-1, . . . are connected to the anode pads (not shown) of the LED array chips 200-1, . . . by bonding wires 223. The cathode pads (not shown) of the LED array chips 200-1, . . . are connected to electrode pads on the printed wiring board 13b by bonding wires 224. The bonding wires are indicated by dotted lines in FIGS. 9B and 9C.

The effect of stress on the drain currents of the driving transistors PMOS 118 to 122 in FIGS. 7, 8A, and 8B will now be explained with reference to the wafer diagram in FIG. 10A and the table in FIG. 10B.

Figures 10A, 10B:
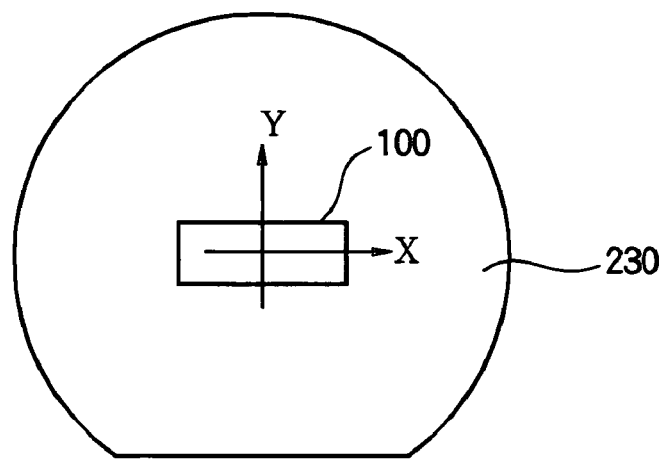
FIG. 10A is a wafer diagram illustrating the orientation of a driver IC.
FIG. 10B is a table of stress coefficients relevant to the driver IC in FIG. 10A.

FIG. 10A schematically shows one driver IC 100 formed on a silicon wafer 230, exaggerating the size of the driver IC 100 for clarity. As above, the X- and Y-axes correspond respectively to the length direction and width direction of the driver IC 100. The change in drain current due to stress is described by the following equations (1) and (2), given by Ikeda et al. in '*Chippu-sutakku-gata maruchichippu jissou ni okeru MOSFET no idodo no hendo ni tsuite*' (On changes in MOSFET mobility in chip-stacked multi-chip mounting), Trans. IEICE of Japan, Vol. J88-C, No. 11, pp. 1-8 (November 2005).

$$\left[\frac{\Delta I_D}{I_D}\right]_0 = \left[\frac{\Delta \mu}{\mu}\right]_0 = \frac{\Pi_S}{2}(\sigma_{11}+\sigma_{22})+\frac{\Pi_{44}}{2}(\sigma_{11}-\sigma_{22}) \quad (1)$$

$$\left[\frac{\Delta I_D}{I_D}\right]_{90} = \left[\frac{\Delta \mu}{\mu}\right]_{90} = \frac{\Pi_S}{2}(\sigma_{11}+\sigma_{22})-\frac{\Pi_{44}}{2}(\sigma_{11}-\sigma_{22}) \quad (2)$$

The symbols $\Pi_S$, $\Pi_{44}$ in equations (1) and (2) denote piezoresistance coefficients with the values given in FIG. 10B; $\sigma_{11}$ and $\sigma_{22}$ denote stress in the Y-axis and X-axis direction in FIG. 10A, with negative values indicating compressive stress. $I_D$ denotes PMOS drain current. The expression $[\Delta I_D/I_D]_0$ in equation (1) represents the factor by which the drain current changes when the drain current flows through the channel parallel to the Y axis. The expression $[\Delta I_D/I_D]_{90}$ in equation (2) represents the factor by which the drain current changes when the drain current flows through the channel parallel to the X axis.

If $[\Delta I_D/I_D]_{90}$ and $[\Delta I_D/I_D]_0$ are rewritten symbolically as $[\Delta I_D/I_D]_X$ and $[\Delta I_D/I_D]_Y$, and $\sigma_{11}$ and $\sigma_{22}$ are rewritten symbolically as $\sigma_Y$ and $\sigma_X$, substitution of the numeric values in FIG. 10B gives the following equations (3) and (4).

$$\left[\frac{\Delta I_D}{I_D}\right]_X = (-717.5\sigma_X + 662.5\sigma_Y)\times 10^{-12}[1/Pa] \quad (3)$$

$$\left[\frac{\Delta I_D}{I_D}\right]_Y = (662.5\sigma_X - 717.5\sigma_Y)\times 10^{-12}[1/Pa] \quad (4)$$

When tensile stress acts on an object, the object generally elongates in the direction of the stress and contracts in an orthogonal direction. When compressive stress acts on an object, the object generally contracts in the direction of the stress and elongates in the orthogonal direction. A tensile stress with force P acting, for example, in the axial direction on a round bar with diameter d and length L, will stretch the round bar in the direction of the force P by an amount $\Delta L$, but the diameter d will contract to a smaller diameter d'. The strain $\epsilon$ in the direction of the force is described as follows.

$$\epsilon = \Delta L/L$$

The strain $\epsilon'$ in directions orthogonal to the direction of the force is described as follows.

$$\epsilon' = (d-d')/d$$

The ratio between the strain $\epsilon$ and the strain $\epsilon'$ is a constant that depends on the material and is referred to as Poisson's ratio $\nu$, which is defined as follows.

$$\nu = |\epsilon/\epsilon'|$$

Since one of $\epsilon$ and $\epsilon'$ represents elongation and the other represents contraction, they have opposite signs, so Poisson's ratio $\nu$ takes on a negative value. From considerations of the mechanics of materials, the absolute value of Poisson's ratio $\nu$ is known to be equal to or less than one-half (0.5). The stress $\sigma$ and strain $\epsilon$ are related as follows.

$$\sigma = E\epsilon$$

E denotes Young's modulus. In the X-axis and Y-axis directions in FIG. 10A, Young's modulus E is known to have the following value.

$$E \approx 170[GPa]$$

If 0.066 is taken as the value of Poisson's ratio $\nu$ for silicon and stress is regarded as a signed quantity, $\sigma_Y$ and $\sigma_X$ are related as in the following equation (5).

$$\sigma_Y = -\nu\sigma_X = -0.066\sigma_X \quad (5)$$

Substitution of this relationship into equations (3) and (4) gives the following equations (6) and (7).

$$\left[\frac{\Delta I_D}{I_D}\right]_X = -761.2\sigma_X \times 10^{-12}[1/Pa] \quad (6)$$

$$\left[\frac{\Delta I_D}{I_D}\right]_Y = 709.9\sigma_X \times 10^{-12}[1/Pa] \quad (7)$$

An experimental value of 0.28 for Poisson's ratio for a silicon material is also known, but even if that value is used, it makes little difference to the result of the following argument.

When compressive stress acts in the X-axis direction, since the stress $\sigma$ takes a negative value, if the drain current flows through the channel of PMOS transistor in the X-axis direction, the expression $[\Delta I_D/I_D]_X$ in equation (6) has a positive value, increasing the drain current, and if the drain current flows through the channel in the Y-axis direction, the expression $[\Delta I_D/I_D]_Y$ in equation (7) has a negative value, reducing the drain current. The ratio of $[\Delta I_D/I_D]_X$ in equation (6) to $[\Delta I_D/I_D]_Y$ in equation (7) can be calculated as in the following equation (8), indicating that the drain current change can be reduced by a factor of about 0.93, or seven percent, by orienting the PMOS transistor channel in the Y-axis direction instead of the X-axis direction.

$$\frac{\left[\frac{\Delta I_D}{I_D}\right]_Y}{\left[\frac{\Delta I_D}{I_D}\right]_X} = -\frac{709.9}{761.2} = -0.933 \tag{8}$$

In each one of the driver ICs 100-1 to 100-26 in the LED print head 13 shown in FIGS. 7, 8A, 8B, and 9A to 9C in the first embodiment, the gate electrodes 118G to 121G of the auxiliary PMOS driving transistors 118 to 121 and the gate electrodes 122-1G to 122-4G of the main PMOS driving transistor 122 are oriented in the X-axis direction, as shown in FIG. 8A, parallel to the row of LEDs in the array chips 200-1 to 200-26. PMOS transistors 118 to 122 are connected to the driving current output terminal DO. When the relevant bit data are asserted to turn on PMOS driving transistors 118 to 122, drain current flows from the source terminal to the drain terminal of each transistor in the Y-axis direction, orthogonal to the X-axis direction, supplying driving current from terminal DO to one of the LEDs.

The LED print head 13 shown in FIGS. 9A to 9C is manufactured in the conventional way, by securing the driver ICs 100-1 to 100-26 and LED array chips 200-1 to 200-26 to the printed wiring board 13b with a thermosetting plastic in a high-temperature atmosphere. As noted above, on return to a room-temperature environment, the substrate material of the printed wiring board 13b contracts by a greater amount than does the silicon substrate of each of the driver ICs 100. This contraction produces compressive stress that acts on each of the driver ICs 100 in the X-axis direction. The compressive stress differs between the central part and the two ends of each driver IC 100. The maximum compressive stress acts on the central part of the driver IC 100, changing the driving current in that part by a greater amount than at the two ends of the driver IC.

In the first embodiment, because the gate electrodes 118G to 121G of PMOS transistors 118 to 121 and the gate electrode fingers 122-1G to 122-4G of PMOS transistor 122 extend in the X-axis direction, driving current flows through the channels of these PMOS transistor in the Y-axis direction. This orientation minimizes the change in current caused by the compressive stress, thereby reducing variations in driving current between the central part of each of the driver ICs 100 and the two ends of the chip.

Figures 11A, 11B, 11C, 11D:
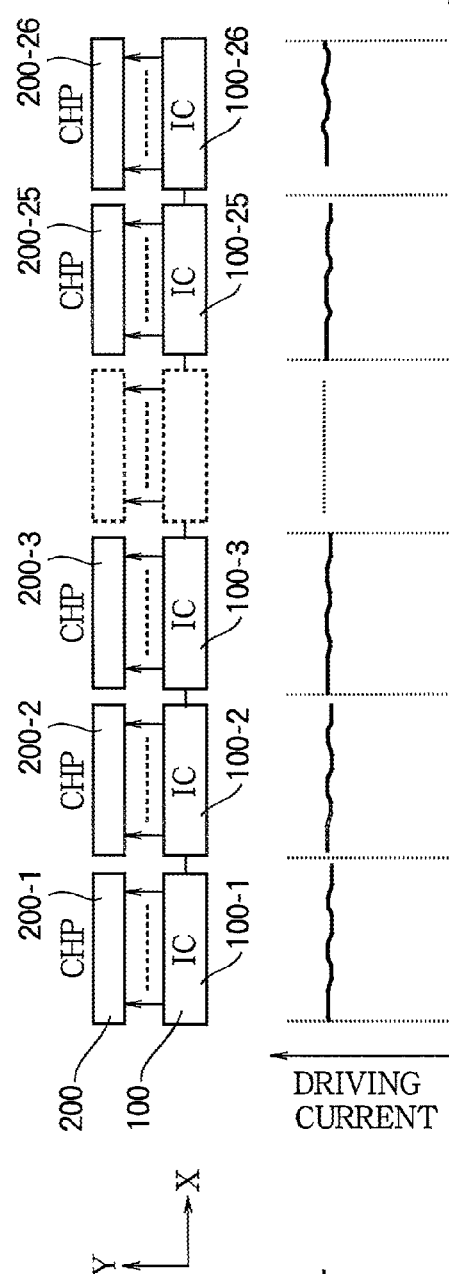
FIG. 11A schematically illustrates the layout of an exemplary conventional LED print head.
FIG. 11B is a graph indicating values of the driving currents supplied to dots in the conventional LED print head at an ambient temperature of 100° C.
FIG. 11C is a graph indicating values of the driving currents supplied to the dots in the conventional LED print head at an ambient temperature of 25° C.
FIG. 11D is a graph indicating values of the driving currents supplied to the dots in the conventional LED print head at an ambient temperature of −20° C.

For comparison, FIG. 11A shows the layout of an exemplary conventional LED print head, and the graphs in FIGS. 11B to 11D indicate values of the driving current supplied to the dots in the conventional LED print head measured at ambient temperatures of 100° C., 25° C., and −20° C., respectively. The LED print head 13 in FIGS. 9A to 9C in the first embodiment is shown in FIG. 12A, and the graphs in FIGS. 12B to 12D indicate values of the driving current supplied to the dots in the LED print head 13 measured at ambient temperatures of 100° C., 25° C., and −20° C., respectively.

In these graphs and similar graphs in subsequent drawings, the horizontal axis indicates dot number or position. The vertical axis indicates the driving current or drain current conducted per unit gate width.

The exemplary conventional LED print head in FIG. 11A is identical to the LED print head 13 in the first embodiment except that the gate electrodes 118G to 121G of PMOS transistors 118 to 121 and the gate electrode fingers 122-1G to 122-4G of PMOS transistor 122 extend in the Y-axis direction, so that driving current flows in the X-axis direction through the channels beneath these gate electrodes and gate electrode fingers.

The ends of the driver ICs 100 in FIGS. 11A and 12A are indicated by corresponding vertical dotted lines in FIGS. 11B to 11D and FIGS. 12B to 12D.

At the high ambient temperature of 100° C., the driving current characteristics of both the conventional LED print head and the LED print head 13 in the first embodiment are substantially flat, as shown in FIGS. 11B and 12B. The driving current output from the driving transistors is substantially uniform with only slight variations. At room temperature (25° C.), both characteristics are still substantially flat but with somewhat greater variations, as shown in FIGS. 11C and 12C. At the low temperature of −20° C., however, the driving current characteristic of each driver IC 100 in the exemplary conventional LED print head becomes upwardly convex as shown in FIG. 11D. The value of the driving current increases substantially in the central part of each IC. In the LED print head 13 in the first embodiment, the driving current characteristic of each driver IC 100 becomes concave as shown in FIG. 12D. The value of the driving current is slightly reduced in the central part of each IC, as compared with the driving current output near the two ends of the chip.

A comparison of FIGS. 11D and 12D shows that the convexity in FIG. 11D is greater than the concavity in FIG. 12D, indicating that at low temperatures, the difference between the driving current at the center of the chip and the driving current at the two ends of the chip is less in the LED print head 13 in the first embodiment than in the exemplary conventional LED print head. These measured results agree well with the calculated results shown in FIG. 10B.

As noted above, variations in driving current supplied by each of the driving circuits in the driver ICs 100 degrade printing quality by causing uneven printing density. LED-to-LED differences in light emission efficiency due to manufacturing variations also have this effect.

The compensation data stored in the memory 104 of the LED print head 13, or in a similar memory in the conventional LED print head, are calculated to compensate for variations measured at a single ambient temperature, normally room temperature. Accordingly, although the compensation data can substantially eliminate the variations in the room-temperature driving current characteristics in FIGS. 11C and 12C, they cannot compensate for the effects of temperature changes. In particular, they cannot compensate for the convexity of the low-temperature driving current characteristic in FIG. 11D and the concavity of the low-temperature driving current characteristic in FIG. 12D.

At room temperature and higher ambient temperatures, the compensation data can reduce the LED-to-LED light output variations to the point where the printed output is not visibly degraded. At low ambient temperatures, however, the variations caused by compressive stress in the exemplary conventional LED print head can become large enough to produce a noticeable pattern of dark vertical streaks due to excess driving current at locations corresponding to the central parts of the driver ICs, despite the use of compensation data.

In the LED print head 13 of the first embodiment, low temperatures produce a relative excess of driving current at the ends of the driver ICs 100, but the excess is smaller than the excess produced at the centers of the driver ICs in the exemplary conventional LED print head, and does not cause such readily noticeable streaks. The first embodiment thus improves the image quality of pages printed at low ambient temperatures, simply by orienting the gate electrodes 118G to 121G and gate electrode fingers 122-1G to 122-4G of the PMOS driving transistors 118 to 122 in the driving circuits 110 parallel to the X-axis direction instead of the Y-axis direction.

This improvement in printed image quality can be obtained not only in the tandem full-color printer 1 shown in FIG. 1 but also in other image forming apparatus in which the LED print heads 13 of the first embodiment may be used, including copiers and other multifunction apparatus, and including monochrome and multicolor image forming apparatus as well as full-color apparatus. The improvement is expected to be most noticeable in full-color apparatus, however, because streaks that would not be noticeable in the output of one print head can become more noticeable in the superimposed output of several print heads.

Second Embodiment

The difference between the first and second embodiments is that the main PMOS driving transistor 122 in the second embodiment includes gate electrode fingers oriented in both the X-axis and Y-axis directions.

Figure 13:
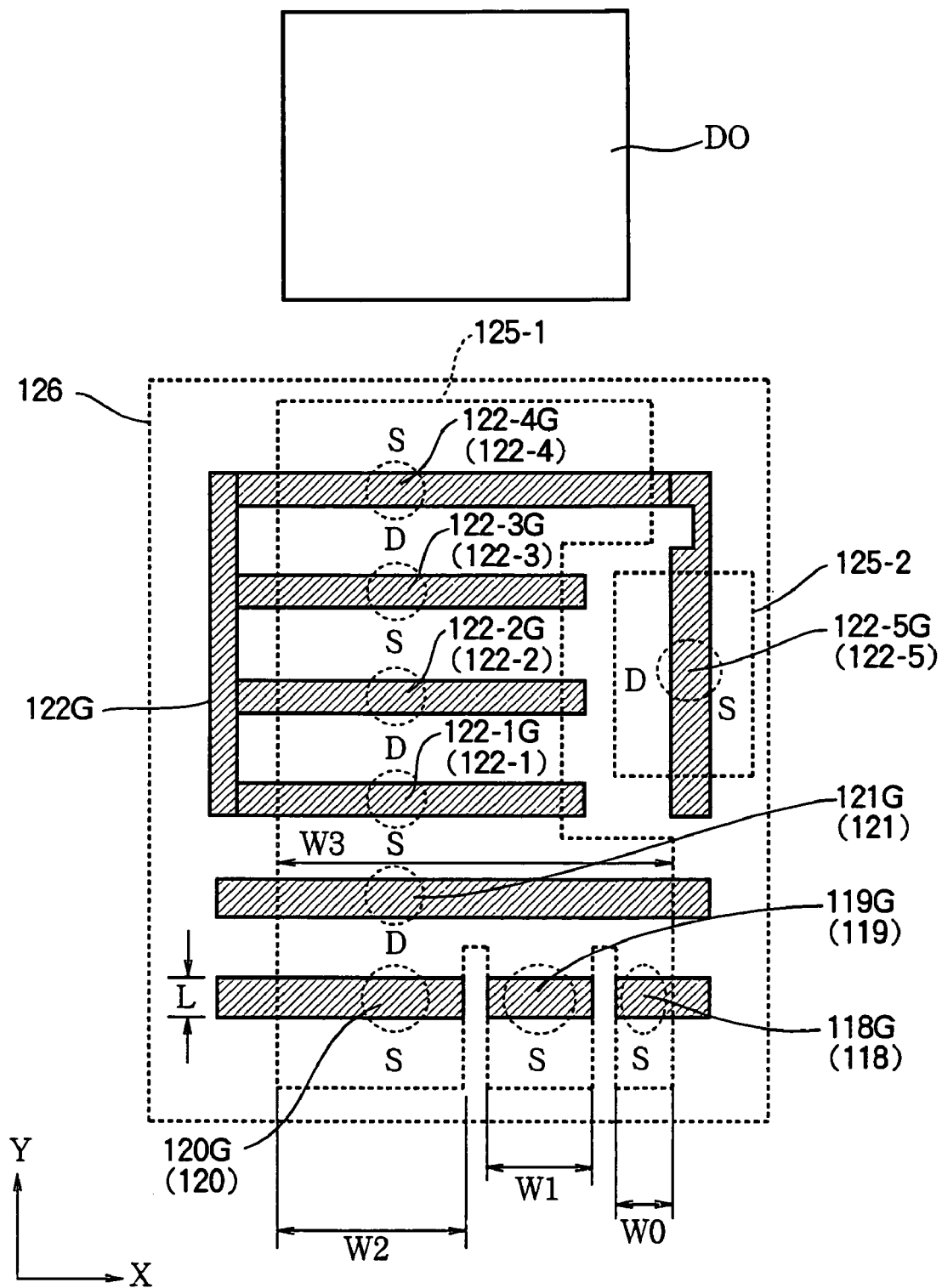
FIG. 13 is a schematic plan view of the driving transistors in FIG. 7 according to a second embodiment of the invention.

In the second embodiment, PMOS transistors 118 to 122 in FIG. 7 are configured as shown in plan view in FIG. 13. The X and Y axes are oriented as in FIG. 5. The gate electrodes of PMOS transistors 118 to 122 are indicated by hatching. FIG. 13 also shows the driving current output terminal DO.

The PMOS transistors 118 to 122 in the second embodiment are disposed in two source-drain-channel areas 125-1 and 125-2. PMOS transistor 122 is configured as five PMOS transistors 122-1 to 122-5 connected in parallel, with four gate electrode fingers 122-1G to 122-4G extending from a common gate terminal 122G and a fifth gate electrode finger 122-5G extending from gate electrode finger 122-4G. The gate electrodes 118G to 121G of PMOS transistors 118 to 121 and the gate terminal and electrodes 122G and 122-1G to 122-5G of PMOS transistor 122 are formed from, for example, polysilicon, separated by an oxide insulating film (not shown) from the n-type silicon substrate 126 as shown in the first embodiment in FIG. 8B.

In a variation of the second embodiment, gate electrode fingers 122-1G to 122-4G of PMOS transistor 122 are interconnected by metal wiring instead of by the common polysilicon gate terminal 122G.

Source (S) and drain (D) regions are formed in the silicon substrate 126. In source-drain-channel area 125-1 the source and drain regions alternate as in the first embodiment, and source and drain regions are also formed in source-drain-channel area 125-2, so that each of the gate electrodes 118G to 121G and gate electrode fingers 122-1G to 122-5G has a source region on one side and a drain region on the other side. The source and drain regions are p-type regions doped with p-type impurity ions implanted using the gate electrodes as a mask. Each of the PMOS transistors 118 to 121 and 122-1 to 122-5 comprises a gate electrode, the channel (not shown) therebelow, and the adjacent source and drain regions, as indicated very approximately by the dashed ellipses and circles in FIG. 13.

Gate electrodes 118G to 121G have the same plan-view shapes in the second embodiment as in the first embodiment. Gate electrodes 121-1G to 121-4G are spaced at equal intervals and extend in the X-axis direction as in the first embodiment, but gate electrodes 122-1G to 122-3G are shorter (in the gate width direction parallel to the X axis) than in the first embodiment. Gate electrode 122-5G extends from one end of gate electrode 122-4G in the Y-axis direction, orthogonal to gate electrode 122-4G, so that gate electrodes 122-4G and 122-5G form a unitary L-shaped structure.

The source regions of the PMOS transistors are connected by metal wiring (not shown) to the power supply VDD (not shown) and the drain regions are connected by metal wiring (not shown) to the driving current output terminal DO in FIG. 13 as in the first embodiment. The PMOS transistors 118 to 122 and the surrounding substrate 126 in FIG. 13 are covered by a protective passivation film (not shown).

As in the first embodiment, all of the gate electrodes 118G, 119G, ... have the same gate length L, and the gate width W0 of gate electrode 118G, the gate width W1 of gate electrode 119G, the gate width W2 of gate electrode 120G, and the gate width W3 of gate electrodes 121G are related as follows.

$$W1 = 2*W0$$

$$W2 = 4*W0$$

$$W3 = 8*W0$$

Except for the layout of the main PMOS driving transistor 122, the LED print head 13 in the second embodiment has the same structure as in the first embodiment and operates in the same way, but since PMOS transistor 122 has gate electrodes oriented in both the X-axis and Y-axis directions, the temperature dependency of the LED driving current differs from the first embodiment, as will be explained below.

Figure 14A:
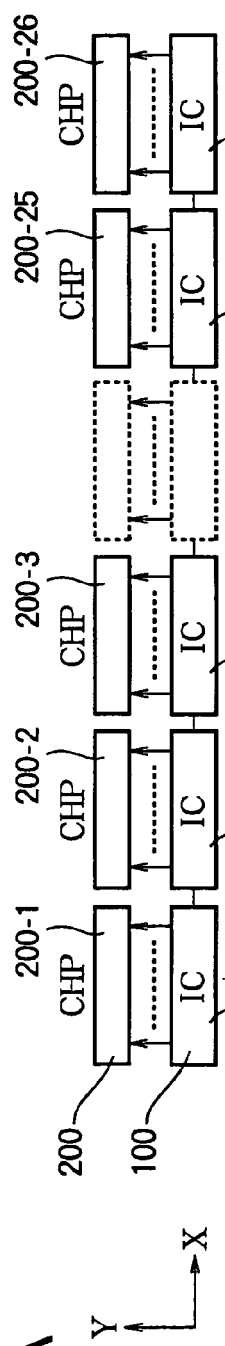
FIG. 14A schematically illustrates the layout of the LED print head in the second embodiment.

The LED print head 13 in the second embodiment includes a plurality of LED array chips 200 (200-1 to 200-26) and a matching plurality of driver ICs 100 (100-1 to 100-26) as shown in FIG. 14A. The graphs in FIGS. 14B to 14D indicate driving current values at an ambient temperature of −20° C. The ends of the driver ICs 100 in FIG. 14A are indicated by corresponding vertical dotted lines in FIGS. 14B to 14D.

The graph in FIG. 14B indicates the total value of the driving current flowing through the channels below gate electrodes 122-1G to 122-4G of PMOS transistor 122. As in the first embodiment, the current characteristic of each driver IC 100 is slightly concave. The driving current is slightly reduced in the central part of each driver IC 100.

The graph in FIG. 14C indicates the value of the driving current flowing through the channel below gate electrode 122-5G of PMOS transistor 122. The current characteristic of each driver IC 100 is slightly convex. Compared with FIG. 14B, the driving current is slightly increased, especially in the central part of each IC. The reason is as follows.

In FIG. 13, drain current flows through the channels below gate electrodes 122-1G to 122-4G in the Y-axis direction, whereas low-temperature compressive stress from the printed wiring board 13b acts in the X-axis direction. As explained in the first embodiment, since the stress $\sigma_X$ has a negative value, the change in drain current flowing through these channels, given by the expression for $[\Delta I_D/I_D]_Y$ in equation (7), has a negative value, reducing the drain current as shown in FIG. 14B.

The drain current flowing through the channel below gate electrode 122-5G in FIG. 13 flows in the X-axis direction, parallel to the direction of low-temperature compressive stress from the printed wiring board 13b. Since the stress $\sigma_X$ has a negative value, the change in the drain current flowing through this channel, given by the expression for $[\Delta I_D/I_D]_X$ in equation (6), has a positive value, increasing the drain current as shown in FIG. 14C.

The graph in FIG. 14D indicates the total value of the drain current flowing through PMOS transistor 122, that is, the total value of the driving current flowing through the channels below gate electrode fingers 122-1G to 122-5G. The total value shown in FIG. 14D is the sum of the drain current flowing through the channels below gate electrode fingers 122-1G to 122-4G, shown in FIG. 14B, and the drain current flowing through the channel below gate electrode finger 122-5G, shown in FIG. 14C.

Figure 14B:
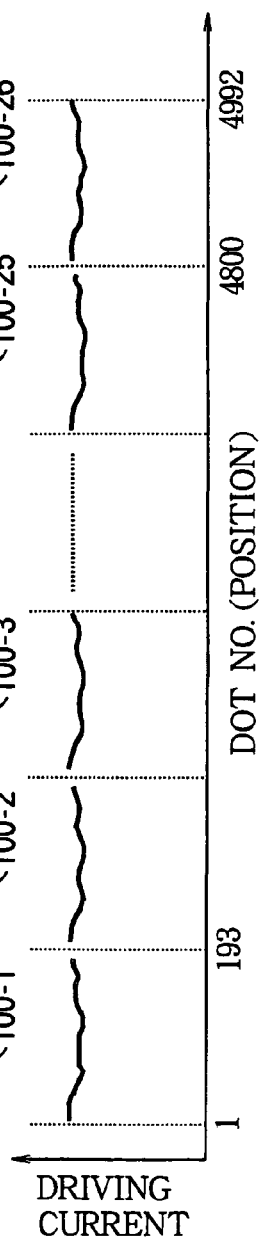
FIGS. 14B and 14C are graphs indicating partial values of the driving currents supplied by the driver ICs in FIG. 14A at an ambient temperature of −20° C.
Figure 14C:
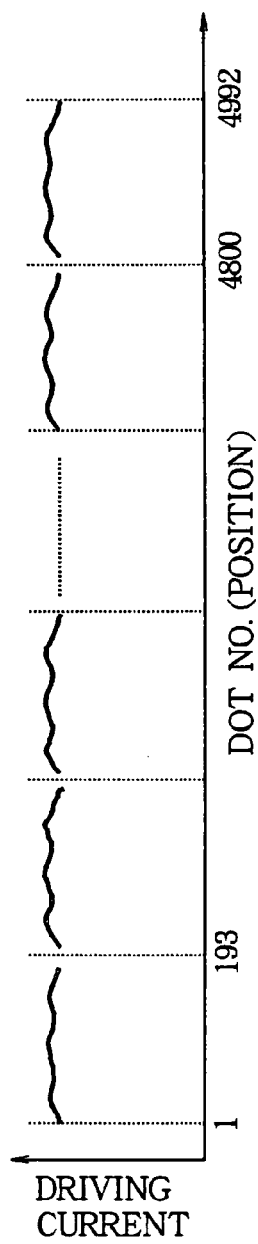
Figure 14D:
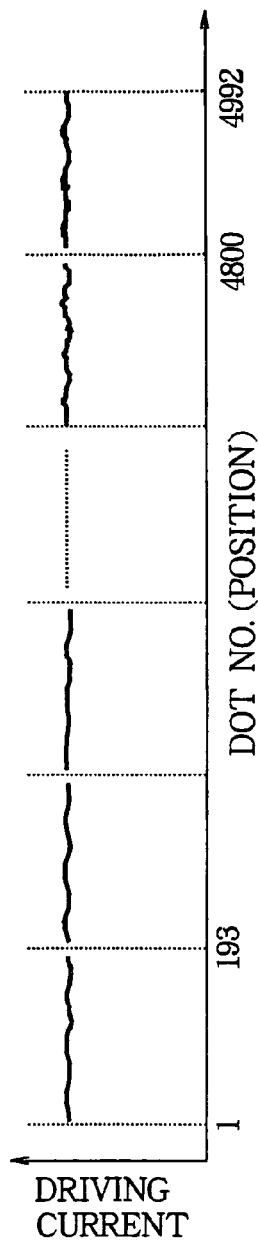
FIG. 14D is a graph indicating total values of the driving currents supplied by the driver ICs in FIG. 14A at an ambient temperature of −20° C.

Since the current characteristic of each driver IC 100 is slightly concave in FIG. 14B and slightly convex in FIG. 14C, the total driving current characteristic shown in FIG. 14D is substantially flat. The value of the driving current is substantially uniform from end to end in each IC.

A comparison of FIGS. 14D and 11D shows that at low ambient temperatures, the difference between the driving current at the center of each chip and the driving current at the two ends of the chip is much less in the LED print head 13 in the second embodiment than in the exemplary conventional LED print. The second embodiment thus produces a considerable improvement in printing quality.

In the LED print head 13 in the second embodiment, low temperatures produce little or no net change in the current supplied by the driver ICs 100. The low-temperature characteristic in FIG. 14D is substantially identical to the room-temperature characteristic in FIG. 12C. The LED print head 13 in the second embodiment can accordingly produce substantially the same high image quality at low ambient temperatures as at room temperatures and at high ambient temperatures. The problem of low-temperature streaking caused by the conventional characteristic shown in FIG. 11D is substantially eliminated.

Figure 15:
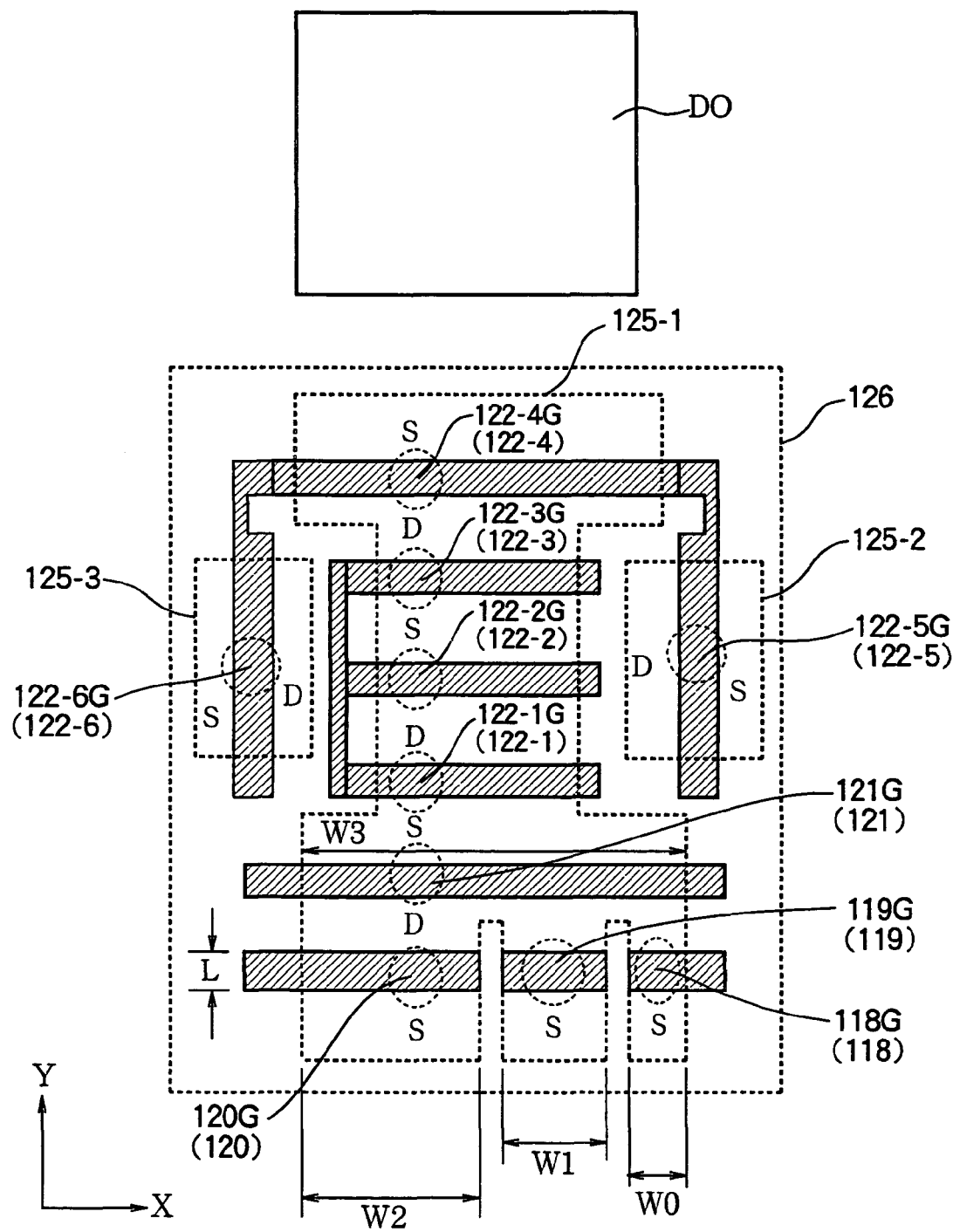
FIG. 15 is a schematic plan view of the driving transistors in a variation of the second embodiment.

FIG. 15 shows a variation of the second embodiment in which PMOS transistor 122 has two gate electrode fingers 122-5G and 122-6G oriented in the Y-axis direction, extending from opposite ends of gate electrode finger 122-4G. These three electrode fingers 122-4G, 122-5G, 122-6G form a unitary U-shaped gate electrode structure surrounding the E-shaped gate electrode structure formed by gate electrode fingers 122-1G, 122-2G, 122-3G and their joining terminal arm. The E-shaped and U-shaped gate electrode structures are interconnected by metal wiring (not shown) to function as a single gate electrode.

PMOS transistor 122 is thus a collection of six constituent PMOS transistors 122-1, 122-2, 122-3, 122-4, 122-5, 122-6, indicated schematically by dotted circles, with source (S) and drain (D) areas as shown. PMOS transistor 122-6 is similar in structure to PMOS transistor 122-5 but is formed in a third source-drain-channel area 125-6. To make room for PMOS transistor 122-6, gate electrode fingers 122-1G, 122-2G, and 122-3G are shorter than in FIG. 13.

PMOS transistors 118 to 121 and their gate electrodes 118G to 121G have the same structure and dimensional relationships as in FIG. 13.

The gate electrode layout in FIG. 15 provides substantially the same effect as the layout in FIG. 13. Since PMOS transistor 122 has gate electrode fingers oriented in both the X-axis and Y-axis directions, the effects of compressive stress acting in the X-axis direction and tensile stress acting in the Y-axis direction at low temperatures substantially cancel out, producing a substantially flat driving current characteristic across the entire width of each driver IC 100 in the X-axis direction.

In another variation of the second embodiment, gate electrode finger 122-5G in FIG. 13 or one or both of gate electrode fingers 122-5G and 122-6G in FIG. 15 extends at an acute angle to the X- and Y-axes.

Third Embodiment

The third embodiment also differs from the first embodiment in that the main PMOS driving transistor 122 includes gate electrode fingers oriented in both the X-axis and Y-axis directions.

Figure 16:
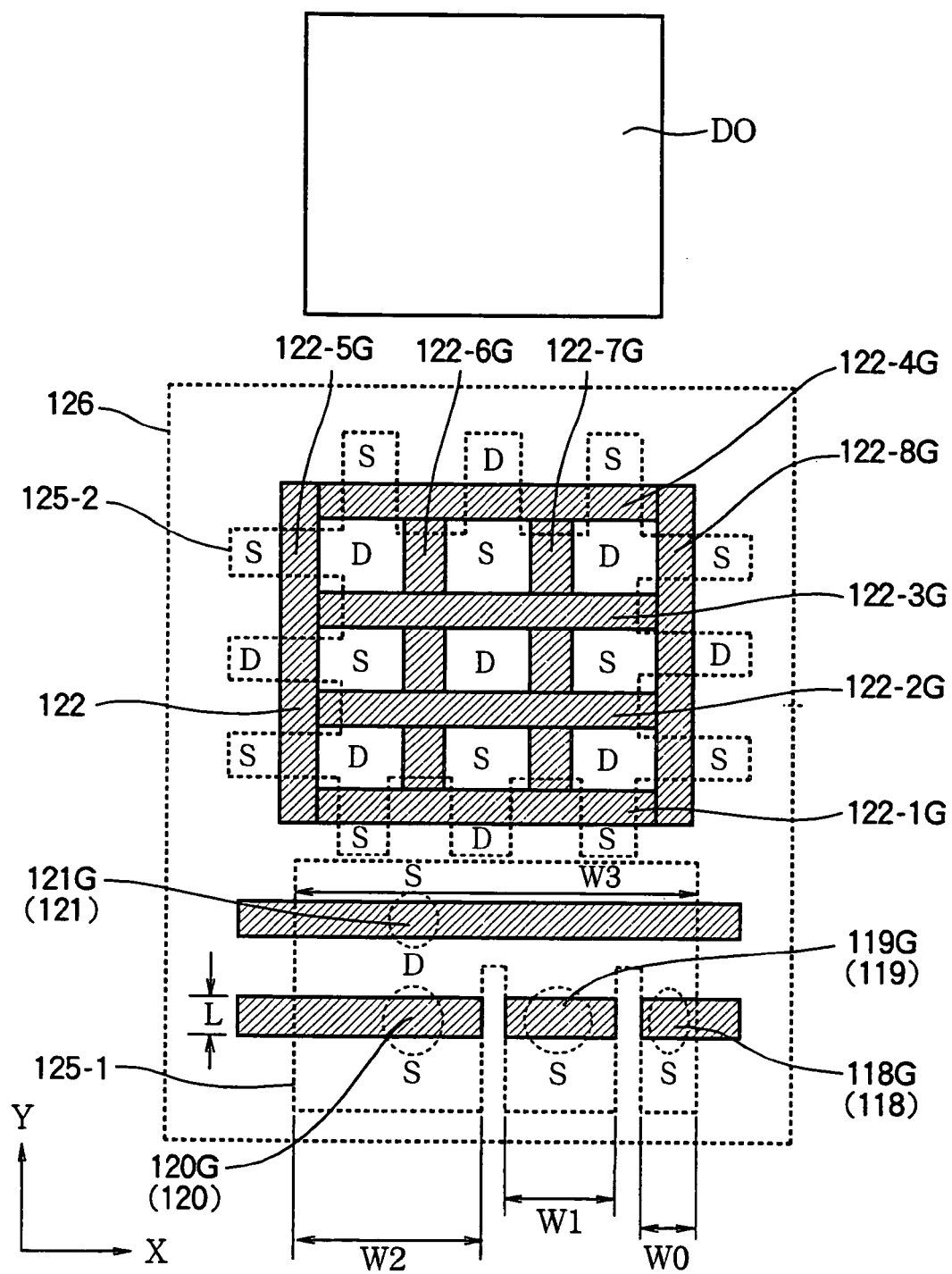
FIG. 16 is a schematic plan view of the driving transistors in FIG. 7 according to a third embodiment of the invention.

In the third embodiment, the PMOS transistors 118 to 122 and driving current output terminal DO in FIG. 7 are configured as shown in plan view in FIG. 16. The X and Y axes are oriented as in FIG. 5. The gate electrodes of PMOS transistors 118 to 122 are indicated by hatching.

The PMOS transistors 118 to 122 in the third embodiment are disposed in two source-drain-channel areas 125-1 and 125-2. PMOS transistors 118 to 122 occupy the first source-drain-channel area 125-1. PMOS transistor 122 has an orthogonal grid of four gate electrode fingers 122-1G to 122-4G extending in the X-axis direction and four gate electrode fingers 122-5G to 122-8G extending in the Y-axis direction and is configured as twenty-four interconnected PMOS transistors occupying the second source-drain-channel area 125-2. The gate electrodes 118G to 121G of PMOS transistors 118 to 121 and the gate electrode fingers 122-1G to 122-8G of PMOS transistor 122 are formed from, for example, polysilicon, separated by an oxide insulating film (not shown) from the n-type silicon substrate as shown in the first embodiment in FIG. 83.

The gate electrode fingers 122-1G to 122-8G of PMOS transistor 122 are formed unitarily, making separate interconnecting members unnecessary, but they may also be interconnected by metal wiring (not shown) for better conductivity.

The orthogonal grid of gate electrode fingers 122-1G to 122-8G bounds nine closed areas, each of which functions as a source (S) or drain (D) region. Source and drain regions are also formed in the first source-drain-channel area 125-1, as in the first embodiment, and in the part of the second source-drain-channel area 125-2 exterior to the orthogonal grid. The source and drain regions in the second source-drain-channel area 125-2 alternate in a checkerboard pattern. The gate electrode of each constituent PMOS transistor has a source region on one side and a drain region on the other side. The source and drain regions are p-type regions doped with p-type impurity ions implanted using the gate electrode fingers as a mask. PMOS transistors 118 to 121 are indicated very approximately by the dashed ellipses and circles in FIG. 16.

Gate electrodes 118G to 121G have the same plan-view shapes in the third embodiment as in the first embodiment. Gate electrode fingers 122-1G to 122-4G are spaced at equal intervals and extend between gate electrode fingers 122-5G and 122-8G, but are shorter (in the gate width direction parallel to the X axis) than in the first embodiment. Gate electrode fingers 122-5G to 122-8G are spaced at equal intervals and extend between gate electrode fingers 122-1G and 122-4G, or the ends thereof. Gate electrode fingers 122-1G to 122-8G are all electrically interconnected and operate as the single gate electrode of PMOS transistor 122 shown in FIG. 7.

The source regions of the PMOS transistors are connected by metal wiring (not shown) to the power supply VDD (not shown) and the drain regions are connected by metal wiring (not shown) to the driving current output terminal DO in FIG. 16 as in the first embodiment. The PMOS transistors 118 to 122 and the surrounding substrate 126 in FIG. 16 are covered by a protective passivation film (not shown).

As in the first embodiment, all of the gate electrodes 118G, 119G, . . . have the same gate length L, and the gate width W0 of gate electrode 118G, the gate width W1 of gate electrode 119G, the gate width W2 of gate electrode 120G, and the gate width W3 of gate electrodes 121G are related as follows.

$$W1 = 2*W0$$

$$W2 = 4*W0$$

$$W3 = 8*W0$$

Except for the layout of the main PMOS driving transistor 122, the LED print head 13 in the third embodiment has the same structure as in the first embodiment and operates in the same way, but since PMOS transistor 122 has gate electrodes oriented in both the X-axis and Y-axis directions, the temperature dependency of the LED driving current differs from the first embodiment, as will be explained below.

Figure 17A:
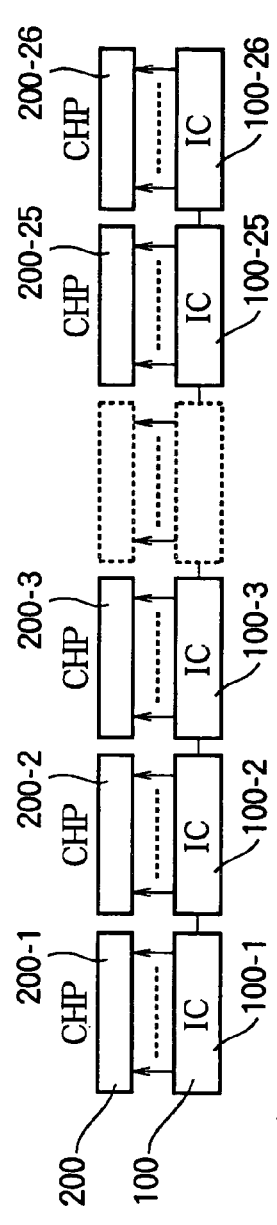
FIG. 17A schematically illustrates the layout of the LED print head in the third embodiment.

The LED print head 13 in the third embodiment includes a plurality of LED array chips 200 (200-1 to 200-26) and a matching plurality of driver ICs 100 (100-1 to 100-26) as shown in FIG. 17A. The graphs in FIGS. 17B to 17D indicate driving values at an ambient temperature of −20° C. The ends of the driver ICs 100 in FIG. 17A are indicated by corresponding vertical dotted lines in FIGS. 17B to 17D.

The graph in FIG. 17B indicates the total value of the drain current (driving current) flowing in the Y-axis direction through the channels below the gate electrode fingers 122-1G to 122-4G of PMOS transistor 122. The Y-axis drain current characteristic of each driver IC 100 is slightly concave. The reason is that low-temperature stress $\sigma_X$ from the printed wiring board 13b compresses the channels in the X-axis direction, particularly near the centers of the chips. Since the direction of drain current flow is orthogonal to the direction of the stress, the change in drain current flow is given by the expression for $[\Delta I_D/I_D]_Y$ in equation (7), which has a negative value, the greatest change occurring in the central parts of the driver ICs 100.

The graph in FIG. 17C indicates the total value of the drain current (driving current) flowing in the X-axis direction through the channels below the gate electrode fingers 122-5G to 122-8G of PMOS transistor 122. The X-axis drain current characteristic of each driver IC 100 is slightly convex. Since the drain current flows parallel to the direction of low-temperature compressive stress, the change in the drain current flowing through these channels is given by the expression for $[\Delta I_D/I_D]_X$ in equation (6), which has a positive value. The drain current is slightly increased, especially in the central part of each driver IC 100.

Figure 17B:
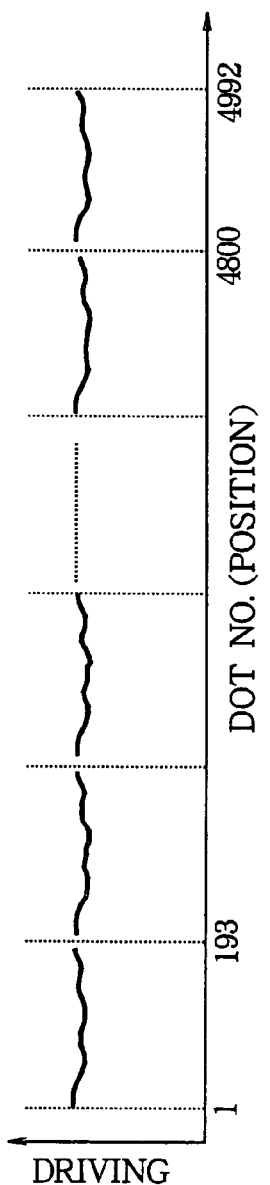
FIGS. 17B and 17C are graphs indicating partial values of the driving currents supplied by the driver ICs in FIG. 17A at an ambient temperature of −20° C.
Figure 17C:
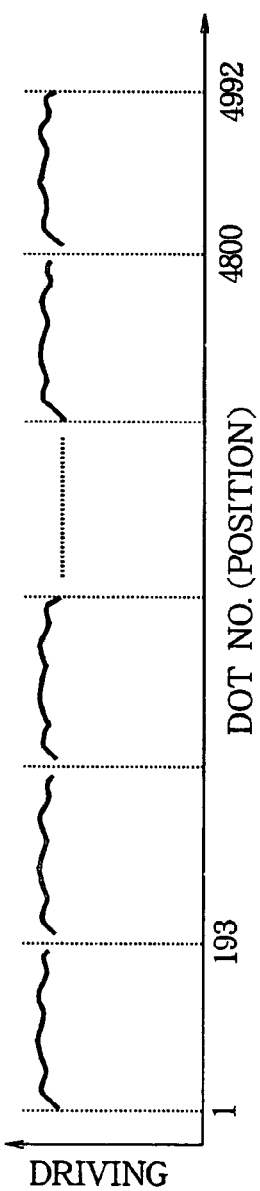
Figure 17D:
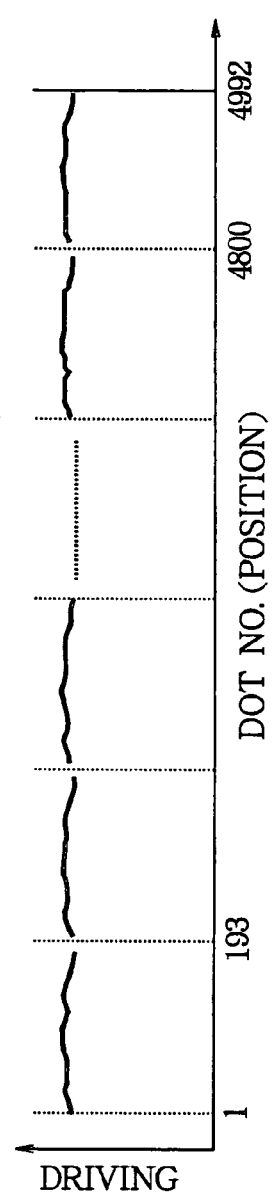
FIG. 17D is a graph indicating total values of the driving currents supplied by the driver ICs in FIG. 17A at an ambient temperature of −20° C.

The graph in FIG. 17D indicates the total value of the driving current flowing through PMOS transistor 122. The total value shown in FIG. 17D is the sum of the drain current flowing through the channels below gate electrodes 122-1G to 122-4G, shown in FIG. 17B, and the drain current flowing through the channels below gate electrodes 122-5G to 122-8G, shown in FIG. 17C.

Since the current characteristic of each driver IC 100 is slightly concave in FIG. 17B and slightly convex in FIG. 17C, the total driving current characteristic shown in FIG. 17D is substantially flat. The value of the drain current is substantially uniform from end to end in each IC.

A comparison of FIGS. 17D and 11D shows that at low ambient temperatures, the difference between the driving current at the center of each chip and the driving current at the two ends of the chip is much less in the LED print head 13 in the third embodiment than in the exemplary conventional LED print. The third embodiment thus produces a considerable improvement in printing quality.

In the LED print head 13 in the third embodiment, low temperatures produce little or no net change in the current supplied by the driver ICs 100. The low-temperature characteristic in FIG. 17D shows no more variation than the room-temperature characteristic in FIG. 12C. The LED print head 13 in the third embodiment can accordingly produce the same high image quality at low ambient temperatures as at room temperature, as in the second embodiment.

Fourth Embodiment

The fourth embodiment differs from the first embodiment in that the gate electrodes of the PMOS driving transistors 118 to 122 are oriented at an acute angle to the X-axis direction.

Figure 18:
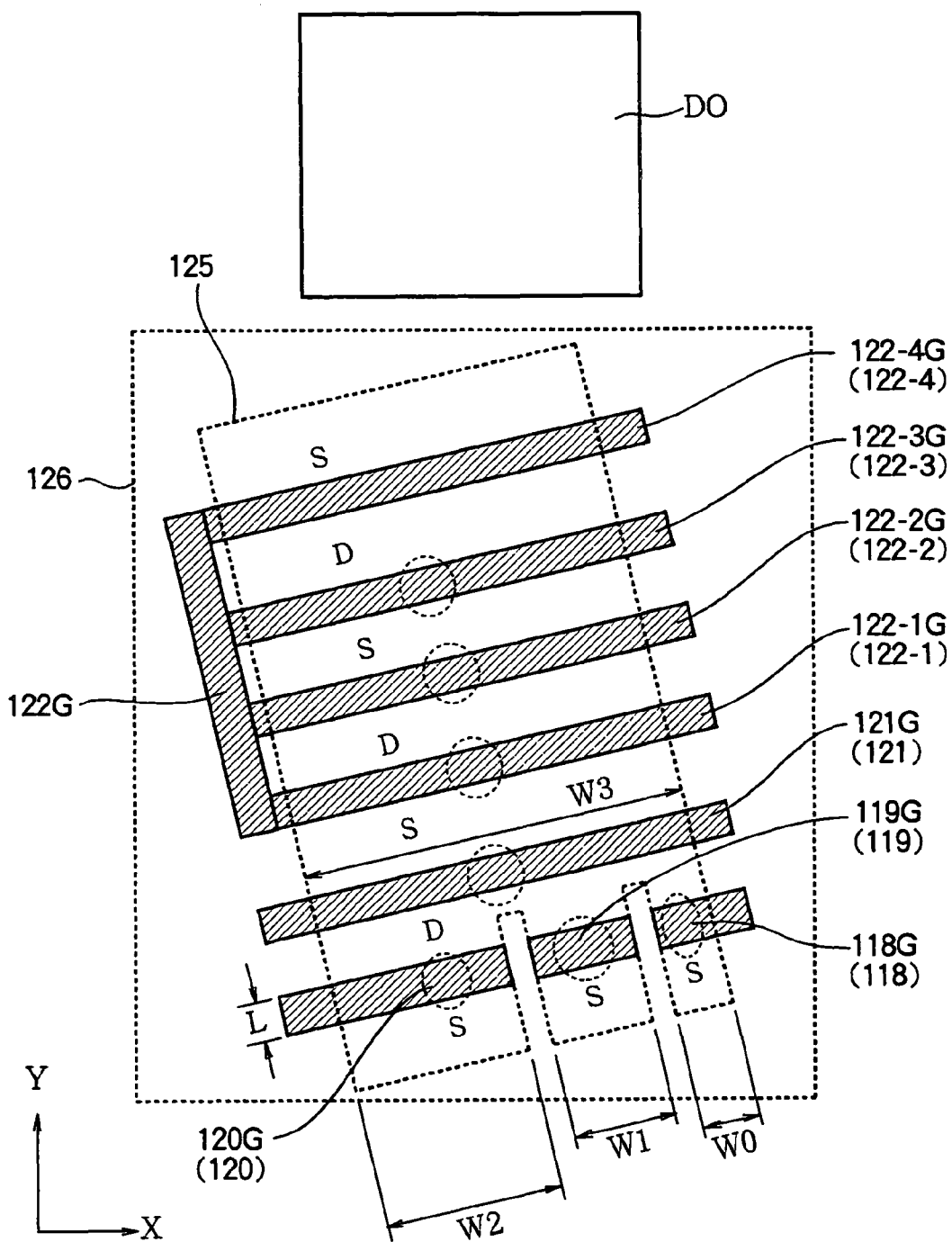
FIG. 18 is a schematic plan view of the driving transistors in FIG. 7 according to a fourth embodiment of the invention.

In the fourth embodiment, the PMOS transistors 118 to 122 and driving current output terminal DO in FIG. 7 are configured as shown in plan view in FIG. 18. The X and Y axes are oriented as in FIG. 5. The gate electrodes of PMOS transistors 118 to 122 are indicated by hatching.

As in the first embodiment, the PMOS transistors 118 to 122 in the fourth embodiment are disposed in a source-drain-channel area 125, and PMOS transistor 122 is configured as four PMOS transistors 122-1 to 122-4 connected in parallel, with respective gate electrode fingers 122-1G to 122-4G extending from a common gate terminal 122G.

Although gate electrodes 118G to 121G and gate electrode fingers 122-1G to 122-4G have the same plan-view shapes in the fourth embodiment as in the first embodiment, their orientation differs from the first embodiment: they extend at an angle θ to the X axis, where θ is an acute angle (0°<θ<90°); they therefore extend at an acute angle to the direction of the row of LEDs in the LED array chips 200 (200-1 to 200-26).

Except for the orientation of the PMOS driving transistors 118 to 122, the LED print head 13 in the fourth embodiment has the same structure as in the first embodiment and operates in the same way, but the temperature dependency of the LED driving current differs from the first embodiment, as explained below.

Figure 19A:
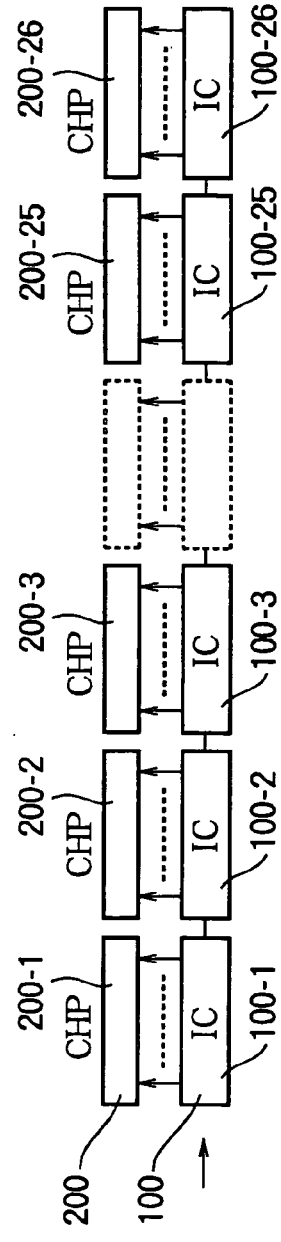
FIG. 19A schematically illustrates the layout of the LED print head in the fourth embodiment.

The LED print head 13 in the fourth embodiment includes a plurality of LED array chips 200 (200-1 to 200-26) and a matching plurality of driver ICs 100 (100-1 to 100-26) as shown in FIG. 19A. The graphs in FIGS. 19B to 19D indicate values of the driving current supplied to the dots in the LED print head 13 measured at an ambient temperature of −20° C., with minimum, medium, and maximum amounts of compensation, respectively. The auxiliary PMOS driving transistors 118 to 122 are all turned off in FIG. 19B and are all turned on in FIG. 19D. The ends of the driver ICs 100 in FIG. 19A are indicated by corresponding vertical dotted lines in FIGS. 19B to 19D.

Figure 19B:
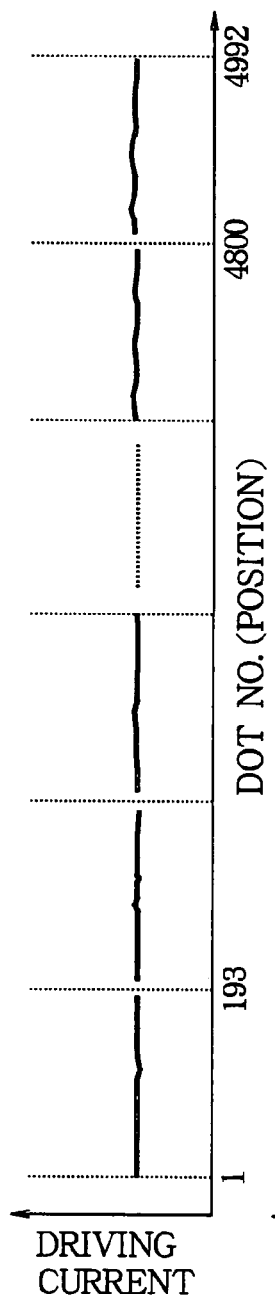
FIGS. 19B, 19C, and 19D are graphs indicating values of driving currents supplied by the driver ICs in FIG. 19A at an ambient temperature of −20° C. with different amounts of compensation.
Figure 19C:
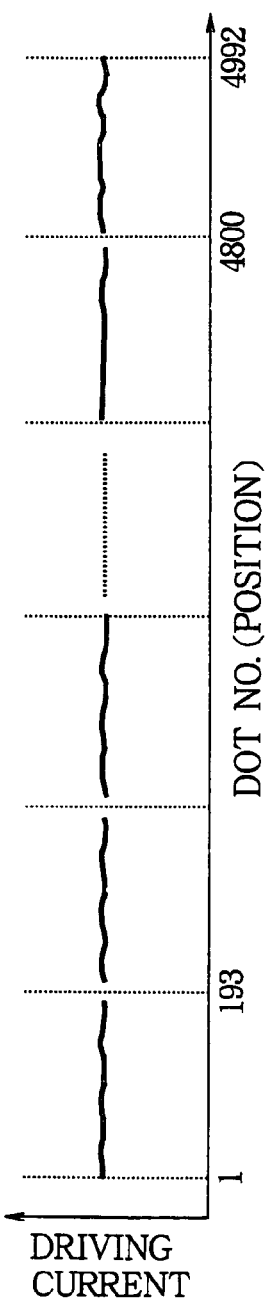
Figure 19D:
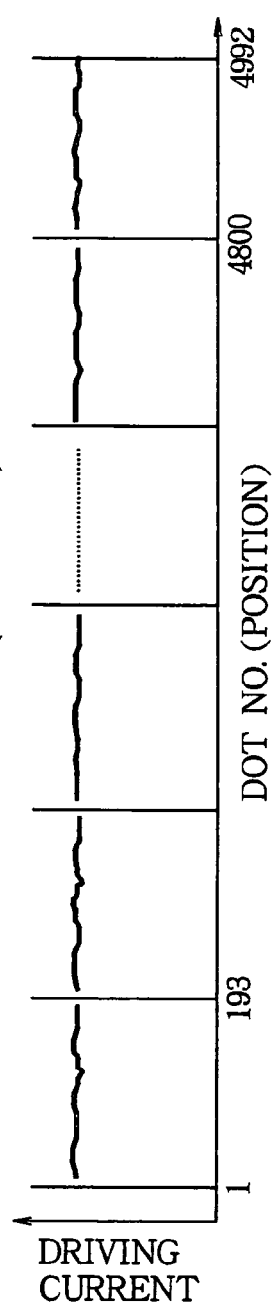

Although small current variations are present in FIGS. 19B to 19D, the driving current characteristic of each chip is substantially flat in all three drawings. The reason is as follows.

In the channels below gate electrodes 118G to 121G and 122-1G to 122-4G in FIG. 18, drain current (driving current) flows at an acute angle (θ) to the Y-axis direction, and therefore at an acute angle (90°−θ) to the X-axis direction, while low-temperature stress $\sigma_X$ from the printed wiring board 13b compresses the channels in the X-axis direction.

As explained in the preceding embodiments, if the drain current were to flow in the Y-axis direction (θ=0°, the change in drain current caused by the compressive stress $\sigma_X$ would be given by the expression for $[\Delta I_D/I_D]_Y$ in equation (7), which yields a negative value because $\sigma_X$ is negative. The drain current would therefore be reduced.

Conversely, if the drain current were to flow in the X-axis direction (θ=90°), the change in the drain current under the same compressive stress $\sigma_X$ would be given by the expression for $[\Delta I_D/I_D]_X$ in equation (6), which yields a positive value. The drain current would therefore be increased.

As the angle θ varies continuously between 0° and 90°, the change in drain current varies continuously between the positive value given by equation (6) and the negative value given by equation (7). For a suitable acute angle θ between 0° and 90° (0°<θ<90°), the change in the drain current must therefore be zero.

The low-temperature characteristics in FIGS. 19B to 19D were measured with substantially this suitable value of the angle θ and show the same flatness as the room-temperature characteristic in FIG. 12C. The downward convexity of the low-temperature characteristic in the first embodiment (FIG. 12D) and the pronounced upward convexity in the low-temperature characteristic of the exemplary conventional LED print head (FIG. 11D) are both eliminated, with corresponding improvements in printing quality.

Since the gate electrodes 118G to 121G of the auxiliary PMOS driving transistors 118 to 121 as well as the gate electrodes 122-1G to 122-4G of the main PMOS driving transistor 122 are oriented at the acute angle of θ degrees to the X-axis direction, the effect of low-temperature compressive stress on the low-temperature driving current characteristics of the compensation PMOS transistors 118 to 121 is also substantially eliminated.

As a result, regardless of what compensation is applied to the individual dots by the driver IC 100, more specifically, regardless of which ones of the auxiliary PMOS driving transistors 118 to 121 are turned on, the change in the amount of current supplied to the driven LEDs is minimized, substantially eliminating the effect of low-temperature stress.

In particular, as a comparison of FIGS. 19B to 19D and FIG. 11D shows, the low-temperature difference between the driving current at the center of each chip and the driving current at the two ends of the chip is much less in the LED print head 13 in the fourth embodiment than in the exemplary conventional LED print. The fourth embodiment produces a marked improvement in printing quality.

The LED print head 13 in the fourth embodiment can produce the same high image quality at low ambient temperatures as at room temperature, as in the second and third embodiments, but with even greater uniformity, since the temperature dependency of the compensation current as well as the main driving current is substantially eliminated.

The invention is not restricted to the embodiments and variations described above. The following are some further exemplary variations.

The driven elements need not be LEDs; the invention is applicable to the driving of arrays of other types of elements as well. For example, the invention may be used in a printer with an organic light-emitting diode (OLED) head including an array of OLEDs, or a thermal printer with an array of resistive heating elements. The invention is also applicable to the driving of a rectangular matrix of light-emitting elements in an image display device.

The invention is not restricted to use with two-terminal driven elements. The driven elements may be, for example, three-terminal light-emitting thyristors or four-terminal light-emitting silicon controlled switches.

The invention is generally applicable to any type IC having a row of output driving terminals if the chip is mounted so as to be subject to compressive stress acting parallel to the row of output terminals.

Those skilled in the art driving will recognize that still further variations are possible within the scope of the invention, which is defined in the appended claims.

What is claimed is:

1. A driver circuit having a plurality of driving transistors for supplying driving current to a plurality of driven elements, the driven elements being disposed in a row oriented in a first direction,
wherein the driving transistors have respective gate electrodes with respective first parts and conduct the driving current below the first parts of the gate electrodes in a second direction differing from the first direction,
wherein the second direction is substantially orthogonal to the first direction, and
wherein the gate electrodes also have respective second parts and the driving transistors conduct the driving current below the second parts of the gate electrodes in a third direction differing from the second direction.

2. The driver circuit of claim 1, wherein the driving transistors are metal-oxide-semiconductor transistors with respective source areas and drain areas located on opposite sides of the first parts of the gate electrodes as seen in the second direction.

3. The driver circuit of claim 1, wherein the driving current flows only in the second direction below the gate electrodes of the driving transistors.

4. The driver circuit of claim 1, wherein the third direction is substantially orthogonal to the second direction.

5. The driver circuit of claim 1, wherein the first and second parts of each one of the gate electrodes form a unitary L-shaped structure.

6. The driver circuit of claim 5, wherein each one of the gate electrodes also includes at least one third part disposed parallel to the first part in a rectangular area bounded on two sides by the unitary L-shaped structure.

7. The driver circuit of claim 1, wherein the first and second parts of each one of the gate electrodes form a unitary U-shaped structure.

8. The driver circuit of claim 7, wherein each one of the gate electrodes also includes at least one third part disposed parallel to the first part in a rectangular area bounded on three sides by the unitary U-shaped structure.

9. The driver circuit of claim 1, wherein the first and second parts of each one of the gate electrodes form a unitary structure bounding a closed area.

10. The driver circuit of claim 1, wherein the first and second parts of each one of the gate electrodes form a unitary structure bounding a plurality of closed areas.

11. The driver circuit of claim 10, wherein the first and second parts of each one of the gate electrodes form an orthogonal grid.

12. The driver circuit of claim 1, wherein the driving transistors include both main driving transistors having gate electrodes with both the first and the second parts and auxiliary driving transistors having gate electrodes with only the first parts.

13. The driver circuit of claim 1, wherein the driving current flows only in the second direction below the gate electrodes of the driving transistors.

14. An optical print head comprising:
the driver circuit of claim 1;
a substrate on which the driver circuit is mounted;
an array of light-emitting elements functioning as the driven elements driven by the driver circuit; and
an array of lenses for focusing light emitted from the array of light-emitting elements.

15. An image forming apparatus comprising:
the optical print head of claim 14; and
a photosensitive member for receiving the light focused by the array of lenses in the optical print head.

* * * * *